(12) United States Patent
Kim et al.

(10) Patent No.: US 12,278,256 B2
(45) Date of Patent: Apr. 15, 2025

(54) DISPLAY APPARATUS INCLUDING LED WITH PLURALITY OF LIGHT EMITTING LAYERS

(71) Applicant: SAMSUNG ELECTRONICS CO., LTD., Suwon-si (KR)

(72) Inventors: Sungyeol Kim, Suwon-si (KR); Kyehoon Lee, Suwon-si (KR); Punjae Choi, Suwon-si (KR); Sooyoung Park, Suwon-si (KR); Chunsoon Park, Suwon-si (KR); Junsung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/379,404

(22) Filed: Oct. 12, 2023

(65) Prior Publication Data

US 2024/0204035 A1 Jun. 20, 2024

Related U.S. Application Data

(63) Continuation of application No. PCT/KR2023/014286, filed on Sep. 20, 2023.

(30) Foreign Application Priority Data

Dec. 15, 2022 (KR) .................. 10-2022-0176357

(51) Int. Cl.
*H01L 27/15* (2006.01)
*G02F 1/1335* (2006.01)
(Continued)

(52) U.S. Cl.
CPC ........ *H01L 27/15* (2013.01); *G02F 1/133536* (2013.01); *G02F 1/133603* (2013.01);
(Continued)

(58) Field of Classification Search
CPC ......... G02F 1/133603; G02F 1/133614; H01L 33/08
See application file for complete search history.

(56) References Cited

U.S. PATENT DOCUMENTS 11,063,179 B2 7/2021 El-Ghoroury et al.
11,158,666 B2 10/2021 Tu et al.
(Continued)

FOREIGN PATENT DOCUMENTS

CN 113093439 A 7/2021
CN 113224212 B 10/2022
(Continued)

OTHER PUBLICATIONS

International Search Report (PCT/ISA/210) dated Jan. 11, 2024 in International Application No. PCT/KR2023/014286.
(Continued)

*Primary Examiner* — Paisley L Wilson
(74) *Attorney, Agent, or Firm* — Sughrue Mion, PLLC

(57) ABSTRACT

A display apparatus, includes: a liquid crystal panel; and a backlight configured to provide light to the liquid crystal panel, the backlight including a substrate and a light-emitting diode (LED) that is mounted on the substrate. The LED includes a plurality of light-emitting layers configured to emit light of different wavelengths. A wavelength of light emitted from each of the plurality of light-emitting layers is greater than or equal to 430 nm and less than or equal to 480 nm.

20 Claims, 14 Drawing Sheets

(51) Int. Cl.
  *G02F 1/13357* (2006.01)
  *H01L 25/065* (2023.01)
  *G02F 1/017* (2006.01)
  *H01L 33/06* (2010.01)
  *H01L 33/38* (2010.01)
  *H01L 33/46* (2010.01)

(52) U.S. Cl.
  CPC .. *G02F 1/133606* (2013.01); *G02F 1/133607* (2021.01); *G02F 1/133614* (2021.01); *G02F 1/13362* (2013.01); *H01L 25/0655* (2013.01); *H01L 27/156* (2013.01); *G02F 1/017* (2013.01); *G02F 2201/346* (2013.01); *G02F 2202/36* (2013.01); *H01L 33/06* (2013.01); *H01L 33/385* (2013.01); *H01L 33/46* (2013.01)

(56) References Cited

U.S. PATENT DOCUMENTS

| | | | |
|---|---|---|---|
| 11,404,604 | B2 | 8/2022 | Kim et al. |
| 11,527,519 | B2 | 12/2022 | Chae et al. |
| 11,874,561 | B2 | 1/2024 | Park et al. |
| 2007/0170444 | A1 | 7/2007 | Cao |
| 2020/0350477 | A1 | 11/2020 | Shim et al. |
| 2022/0139997 | A1 | 5/2022 | Suga et al. |
| 2022/0260877 | A1* | 8/2022 | Park .............. H01L 25/0753 |

FOREIGN PATENT DOCUMENTS

| | | |
|---|---|---|
| JP | 2021-22688 A | 2/2021 |
| KR | 10-2015-0040633 A | 4/2015 |
| KR | 10-1590465 B1 | 2/2016 |
| KR | 10-2020-0083894 A | 7/2020 |
| KR | 10-2020-0087169 A | 7/2020 |
| KR | 10-2020-0127478 A | 11/2020 |
| KR | 10-2364498 B1 | 2/2022 |
| KR | 10-2022-0058643 A | 5/2022 |
| KR | 10-2022-0098649 A | 7/2022 |
| KR | 10-2432220 B1 | 8/2022 |
| WO | WO-2021180096 A1 * | 9/2021 |

OTHER PUBLICATIONS

Written Opinion (PCT/ISA/237) dated Jan. 11, 2024 in International Application No. PCT/KR2023/014286.

* cited by examiner

DISPLAY APPARATUS INCLUDING LED WITH PLURALITY OF LIGHT EMITTING LAYERS

CROSS REFERENCE TO RELATED APPLICATIONS

This application is a by-pass continuation application of International Application No. PCT/KR2023/014286, filed on Sep. 20, 2023, which is based on and claims priority to Korean Patent Application Numbers 10-2022-0176357, filed on Dec. 15, 2022, in the Korean Intellectual Property Office, the disclosures of which are incorporated by reference herein in their entireties. The disclosed embodiments relates to a display apparatus including a backlight unit.

TECHNICAL FIELD

The disclosed embodiments relates to a display apparatus including a backlight unit.

BACKGROUND

A display apparatus is a type of an output device that converts acquired or stored electrical information into visual information and displays the converted information to a user.

A display apparatus may include a liquid crystal panel and a backlight unit (BLU) providing light to the liquid crystal panel. The backlight unit may include a plurality of point light sources capable of independently emitting light. As an example of the point light source, a light-emitting diode (LED) may be used.

The brightness of a screen may be increased to improve the visibility of the screen displayed by a display apparatus. One method of improving the screen brightness is to improve light efficiency of a light-emitting diode.

By improving the light efficiency of the light-emitting diode, energy efficiency of the display apparatus may be improved.

SUMMARY

It is an aspect of the disclosed embodiments to provide a light-emitting diode (LED) with improved light efficiency, and a display apparatus including the same.

It is an aspect of the disclosed embodiments to provide a backlight unit including an LED having a plurality of light-emitting layers, and a display apparatus including the same.

It is an aspect of the disclosed embodiments to provide an LED having a plurality of light-emitting layers that emit blue light with different wavelengths, and a display apparatus including the same.

It is an aspect of the disclosed embodiments to provide a display apparatus including a plurality of light-emitting layers including a plurality of cells, as the plurality of light-emitting layers emitting light with different wavelengths.

A display apparatus may include: a liquid crystal panel: and a backlight configured to provide light to the liquid crystal panel, the backlight including a substrate and a light-emitting diode (LED) that is mounted on the substrate. The LED may include a plurality of light-emitting layers configured to emit light of different wavelengths. A wavelength of light emitted from each of the plurality of light-emitting layers may be greater than or equal to 430 nm and less than or equal to 480 nm.

A wavelength difference between lights emitted from two of the plurality of light-emitting layers may be greater than or equal to 5 nm.

The LED may further include: a growth substrate, the plurality of light emitting layers being disposed below the growth substrate, and a first distributed Bragg reflector (DBR) layer disposed below the plurality of light-emitting layers.

The LED may further include a second DBR layer disposed on an upper surface of the growth substrate.

The plurality of light-emitting layers may include: a first light-emitting layer configured to emit light of a first wavelength, the first light-emitting layer being disposed below the growth substrate, the first light-emitting layer including a first n-type semiconductor layer and a first p-type semiconductor layer, a second light-emitting layer configured to emit light of a second wavelength that is longer than the first wavelength, the second light-emitting layer being disposed below the first light-emitting layer, the second light-emitting layer including a second n-type semiconductor layer and a second p-type semiconductor layer, and a third light-emitting layer configured to emit light of a third wavelength that is longer than the second wavelength, the third light-emitting layer being disposed below the second light-emitting layer, the third light-emitting layer including a third n-type semiconductor layer and a third p-type semiconductor layer.

The LED may further include: a first blocking layer configured to block electrical connection between the first p-type semiconductor layer and the second n-type semiconductor layer, and a second blocking layer configured to block electrical connection between the second p-type semiconductor layer and the third n-type semiconductor layer.

The LED may further include: a common cathode configured to be commonly connected to the first n-type semiconductor layer, the second n-type semiconductor layer, and the third n-type semiconductor layer, and a common anode configured to be commonly connected to the first p-type semiconductor layer, the second p-type semiconductor layer, and the third p-type semiconductor layer.

The LED may further include: a first cathode configured to be connected to the first n-type semiconductor layer, a second cathode configured to be connected to the second n-type semiconductor layer, a third cathode configured to be connected to the third n-type semiconductor layer, and a common anode configured to be commonly connected to the first p-type semiconductor layer, the second p-type semiconductor layer, and the third p-type semiconductor layer.

The plurality of light-emitting layers may include: a first light-emitting layer disposed below the growth substrate, the first light-emitting layer including a first cell and a second cell configured to emit light of a first wavelength, a second light-emitting layer disposed below the first light-emitting layer, the second light-emitting layer including a third cell and a fourth cell configured to emit light of a second wavelength that is longer than the first wavelength, and a third light-emitting layer disposed below the second light-emitting layer, the third light-emitting layer including a fifth cell and a sixth cell configured to emit light of a third wavelength that is longer than the second wavelength.

The LED may further include: a first connection electrode configured to connect a first cell p-type semiconductor layer of the first cell with a second n-type semiconductor layer of the second cell, a second connection electrode configured to connect a third cell p-type semiconductor layer of the third cell with a fourth n-type semiconductor layer of the fourth cell, and a third connection electrode configured to connect a fifth cell p-type semiconductor layer of the fifth cell with a sixth n-type semiconductor layer of the sixth cell.

The LED may further include: a first blocking layer configured to block electrical connection (i) between the first connection electrode and a first cell n-type semiconductor layer of the first cell, and (ii) between the first connection electrode and a second cell p-type semiconductor layer of the second cell, a second blocking layer configured to block electrical connection (i) between the second connection electrode and a third cell n-type semiconductor layer of the third cell, and (ii) between the second connection electrode and a fourth cell p-type semiconductor layer of the fourth cell, and a third blocking layer configured to block electrical connection (i) between the third connection electrode and a fifth cell n-type semiconductor layer of the fifth cell, and (ii) between the third connection electrode and a sixth cell p-type semiconductor layer of the sixth cell.

The LED may further include: a common cathode configured to be commonly connected to the first cell n-type semiconductor layer, the third cell n-type semiconductor layer, and the fifth cell n-type semiconductor layer, and a common anode configured to be commonly connected to the second cell p-type semiconductor layer, the fourth cell p-type semiconductor layer, and the sixth cell p-type semiconductor layer.

The LED may further include: a first cathode configured to be connected to the first cell n-type semiconductor layer, a second cathode configured to be connected to the third cell n-type semiconductor layer, a third cathode configured to be connected to the fifth cell n-type semiconductor layer, and a common anode configured to be commonly connected to the second cell p-type semiconductor layer, the fourth cell p-type semiconductor layer, and the sixth cell p-type semiconductor layer.

The backlight may further include: a diffuser plate disposed between the substrate and the liquid crystal panel, and an optical sheet disposed on one surface of the diffuser plate between the diffuser plate and the liquid crystal panel, the optical sheet comprising at least one of a light conversion sheet, a prism sheet, or a reflective polarizing sheet.

The LED may be mounted on the substrate in a chip on board (COB) arrangement.

The optical sheet may include the light conversion sheet. The light conversion sheet may include a plurality of quantum dots (QDs) that are configured to convert a wavelength of light.

The optical sheet may further include the prism sheet. The prism sheet may be configured to concentrate light to increase luminance. The prism sheet may include triangular prism patterns arranged adjacent to each other to form a plurality of bands.

The optical sheet may further include the reflective polarizing sheet. The reflective polarizing sheet may be configured to transmit a first portion of incident light while reflecting a second portion of the incident light to increase the luminance.

The first light-emitting layer may further include a first multi quantum well (MQW) disposed between the first n-type semiconductor layer and the first p-type semiconductor layer. The second light-emitting layer may further include a second MQW disposed between the second n-type semiconductor layer and the second p-type semiconductor layer. The third light-emitting layer may further include a third MQW disposed between the third n-type semiconductor layer and the third p-type semiconductor layer.

The first cell may include a first cell p-type semiconductor layer, a first cell n-type semiconductor layer, and a first cell multi quantum well (MQW), the first cell MQW being disposed between the first cell p-type semiconductor layer and the first cell n-type semiconductor layer. The second cell may include a second cell p-type semiconductor layer, a second cell n-type semiconductor layer, and a second cell MQW, the second cell MQW being disposed between the second cell p-type semiconductor layer and the second cell n-type semiconductor layer. The third cell may include a third cell p-type semiconductor layer, a third cell n-type semiconductor layer, and a third cell MQW, the third cell MQW being disposed between the third cell p-type semiconductor layer and the third cell n-type semiconductor layer. The fourth cell may include a fourth cell p-type semiconductor layer, a fourth cell n-type semiconductor layer, and a fourth cell MQW, the fourth cell MQW being disposed between the fourth cell p-type semiconductor layer and the fourth cell n-type semiconductor layer. The fifth cell may include a fifth cell p-type semiconductor layer, a fifth cell n-type semiconductor layer, and a fifth cell MQW, the fifth cell MQW being disposed between the fifth cell p-type semiconductor layer and the fifth cell n-type semiconductor layer. The sixth cell may include a sixth cell p-type semiconductor layer, a sixth cell n-type semiconductor layer, and a sixth cell MQW, the sixth cell MQW being disposed between the sixth cell p-type semiconductor layer and the sixth cell n-type semiconductor layer.

According to an aspect of the disclosed embodiments, a light-emitting diode (LED) with improved light efficiency, and a display apparatus including the same can be provided.

According to an aspect of the disclosed embodiments, a backlight unit including an LED including a plurality of light-emitting layers, and a display apparatus including the same can be provided.

According to an aspect of the disclosed embodiments, an LED including a plurality of light-emitting layers that emit blue light with different wavelengths, and a display apparatus including the same can be provided.

According to an aspect of the disclosed embodiments, a display apparatus including a plurality of light-emitting layers including a plurality of cells, as the plurality of light-emitting layers emitting light with different wavelengths, can be provided.

DETAILED DESCRIPTION

Figure 1:
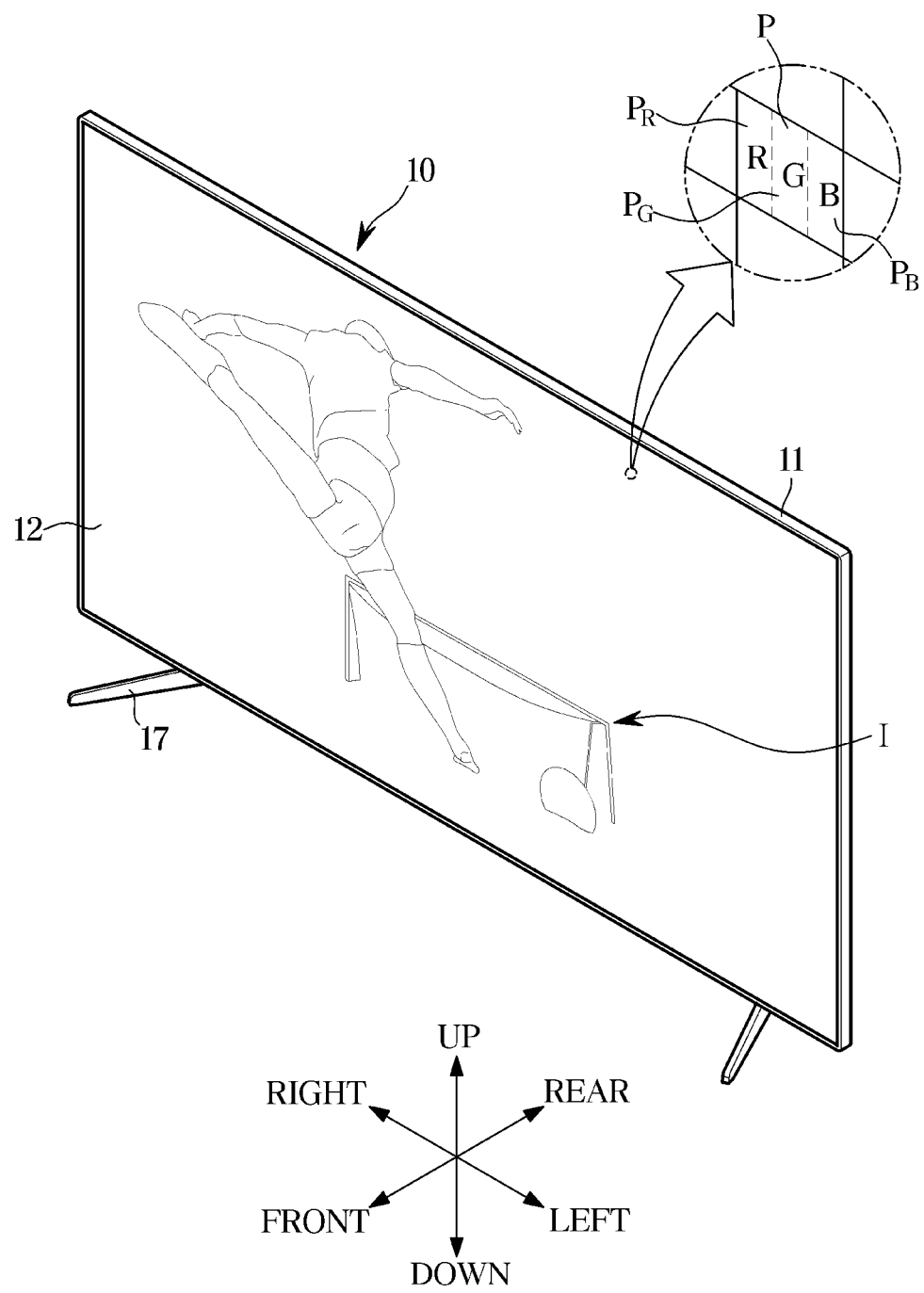
FIG. 1 is a perspective view of a display apparatus according to an embodiment.

Embodiments described in the specification and configurations shown in the accompanying drawings are merely examples, and various modifications may replace the embodiments and the drawings at the time of filing of the application.

Further, identical symbols or numbers in the drawings denote components or elements configured to perform substantially identical functions.

Further, terms used herein are only for the purpose of describing particular embodiments and are not intended to limit to the disclosed embodiments. The singular form is intended to include the plural form as well, unless the context clearly indicates otherwise. It should be further understood that the terms "include," "including," "have," and/or "having" specify the presence of stated features, integers, steps, operations, elements, components, and/or groups thereof, but do not preclude the presence or addition of one or more other features, integers, steps, operations, elements, components, and/or groups thereof.

Further, it should be understood that, although the terms "first," "second," etc. may be used herein to describe various elements, the elements are not restricted by the terms, and the terms are only used to distinguish one element from another. For example, a first element could be termed a second element, and similarly, a second element could be termed a first element without departing from the scope of the disclosed embodiments. The term "and/or" includes combinations of one or all of a plurality of associated listed items.

Figure 2:
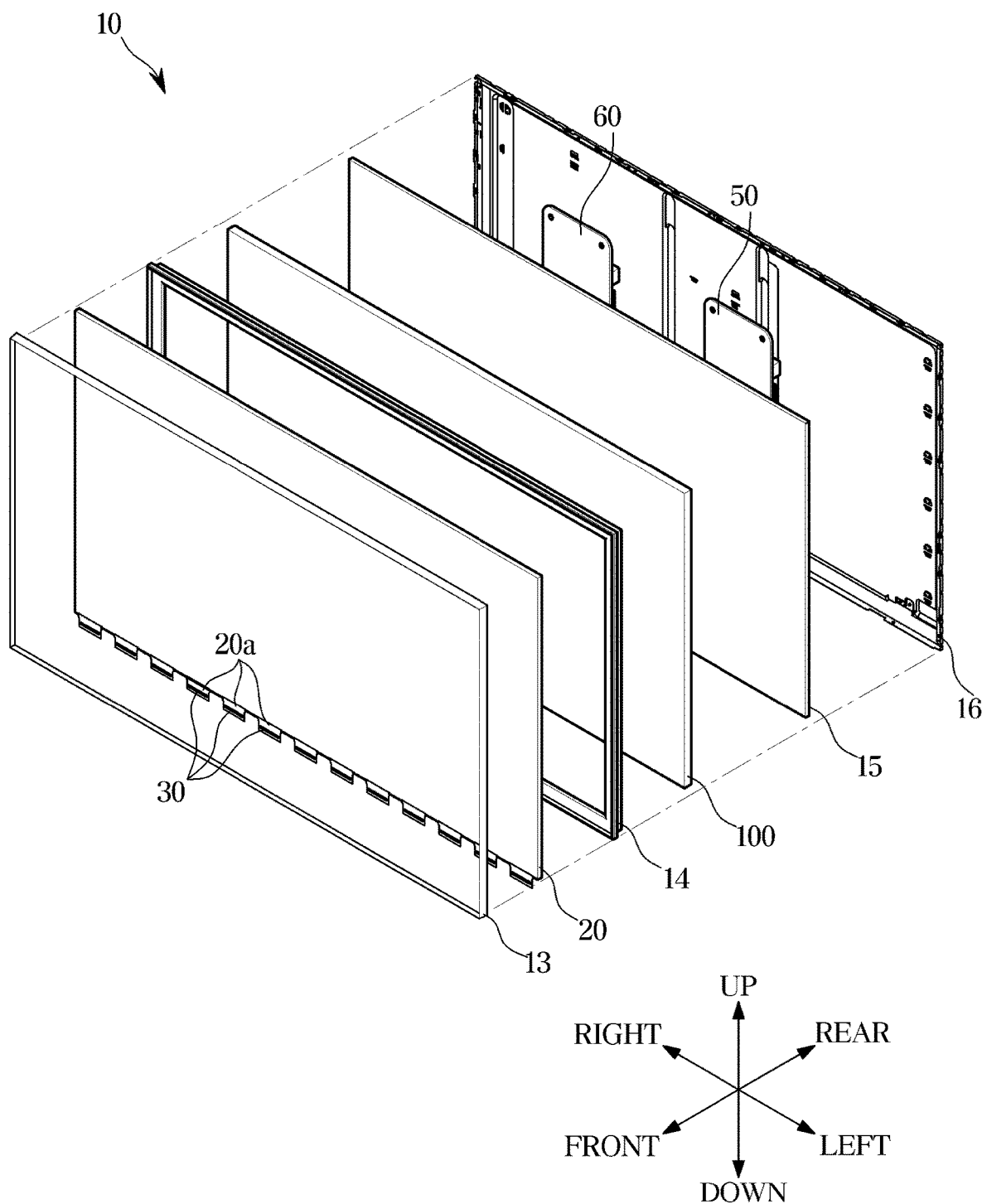
FIG. 2 is an exploded perspective view of a display apparatus according to an embodiment.
Figure 3:
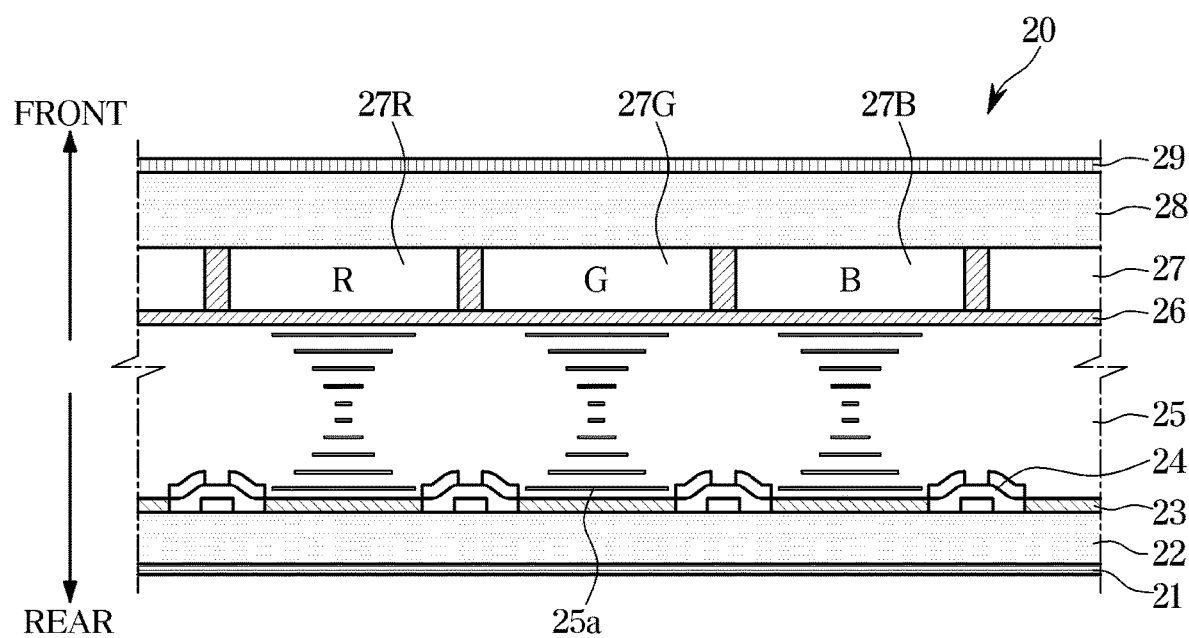
FIG. 3 is a side cross-sectional view of a liquid crystal panel of a display apparatus according to an embodiment.
Figure 4:
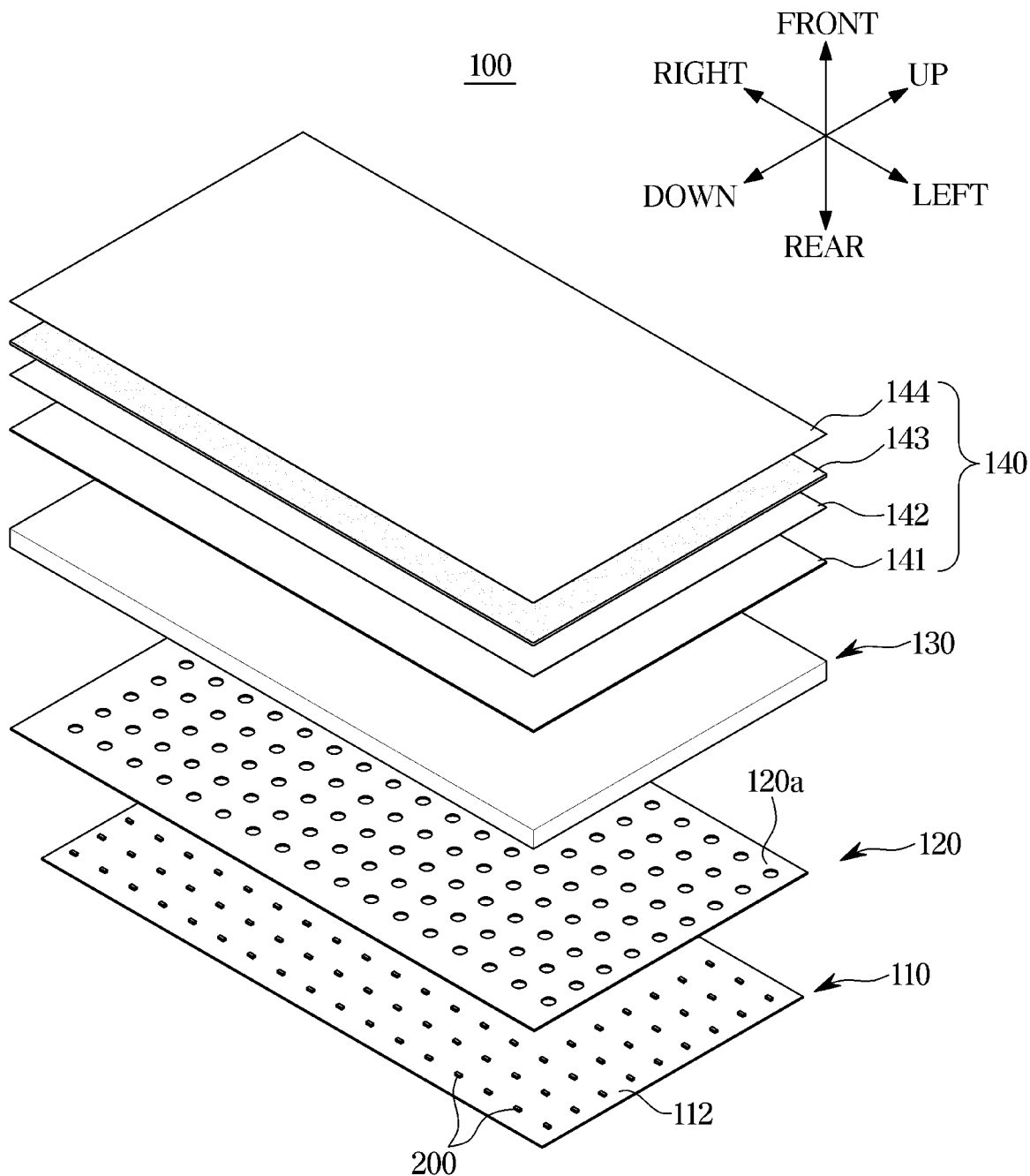
FIG. 4 is an exploded perspective view of a backlight unit of a display apparatus according to an embodiment.

FIG. 1 is a perspective view of a display apparatus according to an embodiment. FIG. 2 is an exploded perspective view of a display apparatus according to an embodiment. FIG. 3 is a side cross-sectional view of a liquid crystal panel of a display apparatus according to an embodiment. FIG. 4 is an exploded perspective view of a backlight unit of a display apparatus according to an embodiment.

A display apparatus 10 is a device capable of processing an image signal received from the outside and visually displaying a processed image. Hereinafter, a case in which the display apparatus 10 is a television (TV) is exemplified, but is not limited thereto. For example, the display apparatus 10 may be implemented in various forms, such as a monitor, a portable multimedia device, a portable communication device, and the like, and the form of the display apparatus 10 is not limited as long as it is a device that visually displays an image.

In addition, the display apparatus 10 may be a large format display (LFD) installed outdoors, such as on a roof of a building or at a bus stop. The outdoors is not necessarily limited to the outdoors, and the display apparatus 10 may be installed wherever a large number of people may enter and exit, even indoors such as at subway stations, shopping malls, movie theaters, office buildings, and stores.

The display apparatus 10 may receive content data including video data and audio data from various content sources and output video and audio corresponding to the video data and audio data, respectively. For example, the display apparatus 10 may receive content data through a broadcast reception antenna or a wired cable, receive content data from a content playback apparatus, or receive content data from a content-providing server of a content provider.

As shown in FIG. 1, the display apparatus 10 may include a body 11, a screen 12 displaying an image I, and a supporter 17 disposed below the body 11 for supporting the body 11.

The body 11 may form an exterior of the display apparatus 10, and inside the body 11, provided may be components configured to allow the display apparatus 10 to display the image I or perform various functions. The body 11 shown in FIG. 1 has a flat plate shape, but the shape of the body 11 is not limited to that shown in FIG. 1. For example, the body 11 may have a curved plate shape.

The screen 12 may be formed on a front surface of the body 11 and may display the image I. For example, the screen 12 may display a still image or a video. In addition, the screen 12 may display a two-dimensional (2D) plane image or a three-dimensional (3D) stereoscopic image using binocular parallax of a user.

A plurality of pixels P may be formed on the screen 12, and the image I displayed on the screen 12 may be formed by light emitted from each of the plurality of pixels P. For example, the image I may be formed on the screen 12 by combining light emitted from the plurality of pixels P like a mosaic.

Each of the plurality of pixels P may emit light of various brightness and various colors. For example, each of the plurality of pixels P may include a non-self-luminous panel (e.g., a liquid crystal panel) that may transmit or block light emitted by a light source device, or the like.

In order to emit light of various colors, each of the plurality of pixels P may include sub-pixels $P_R$, $P_G$, and $P_B$.

The sub-pixels $P_R$, $P_G$, and $P_B$ may include a red sub-pixel $P_R$ capable of emitting red light, a green sub-pixel $P_G$ capable of emitting green light, and a blue sub-pixel $P_B$ capable of emitting blue light. For example, the red light may represent light having a wavelength of approximately 620 nm (nanometers, one billionth of a meter) to 750 nm, the green light may represent light having a wavelength of approximately 495 nm to 570 nm, and the blue light may represent light having a wavelength of approximately 430 nm to 495 nm.

By combining the red light of the red sub-pixel $P_R$, the green light of the green sub-pixel $P_G$, and the blue light of the blue sub-pixel $P_B$, each of the plurality of pixels P may emit light of various brightness and various colors.

As shown in FIG. 2, various components for generating the image I (see FIG. 1) on the screen 12 (see FIG. 1) may be provided in the body 11.

For example, the body 11 may include a backlight unit 100 which is a surface light source, a liquid crystal panel 20 configured to block or transmit light emitted from the backlight unit 100, a control assembly 50 configured to control operations of the backlight unit 100 and the liquid crystal panel 20, and a power supply assembly 60 configured to supply power to the backlight unit 100 and the liquid crystal panel 20. In addition, the body 11 may include a bezel 13, a frame middle mold 14, a bottom chassis 15, and a rear cover 16 for supporting the liquid crystal panel 20, the backlight unit 100, the control assembly 50, and the power supply assembly 60.

The backlight unit 100 may include a point light source that emits monochromatic light or white light, and may refract, reflect, and scatter the light to convert the light emitted from the point light source into a uniform surface light. For example, the backlight unit 100 may include a plurality of light sources emitting monochromatic light or white light, a diffuser plate diffusing light incident from the plurality of light sources, a reflector sheet reflecting light emitted from a rear surface of the diffuser plate and the plurality of light sources, and an optical sheet refracting and scattering light emitted from a front surface of the diffuser plate.

As described above, the backlight unit 100 may refract, reflect, and scatter the light emitted from the point light source to emit a uniform surface light in a forward direction.

As described above, the backlight unit 100 may refract, reflect, and scatter the light emitted from the point light sources to emit a uniform surface light in a forward direction.

A structure of the backlight unit 100 will be described in more detail below.

The liquid crystal panel 20 may be provided in front of the backlight unit 100, and may block or transmit light emitted from the backlight unit 100 to form the image I.

A front surface of the liquid crystal panel 20 may form the screen 12 of the display apparatus 10 described above, and the liquid crystal panel 20 may include the plurality of pixels P. The plurality of pixels P included in the liquid crystal panel 20 may independently block or transmit the light emitted from the backlight unit 100, and the light transmitted through the plurality of pixels P may form the image I to be displayed on the screen 12.

For example, as shown in FIG. 3, the liquid crystal panel 20 may include a first polarizing film 21, a first transparent substrate 22, a pixel electrode 23, a thin-film transistor (TFT) 24, a liquid crystal layer 25, a common electrode 26, a color filter 27, a second transparent substrate 28, and a second polarizing film 29.

The first transparent substrate 22 and the second transparent substrate 28 may fixedly support the pixel electrode 23, the thin-film transistor 24, the liquid crystal layer 25, the common electrode 26, and the color filter 27. The first and second transparent substrates 22 and 28 may be formed of tempered glass or transparent resin.

The first polarizing film 21 and the second polarizing film 29 may be provided on outer sides of the first and second transparent substrates 22 and 28, respectively.

The first polarizing film 21 and the second polarizing film 29 may transmit specific light and block the other light, respectively. For example, the first polarizing film 21 transmits light with a magnetic field oscillating in a first direction while blocking the other light. The second polarizer film 29 transmits light with a magnetic field oscillating in a second direction while blocking the other light. In this instance, the first and second directions may be perpendicular to each other. Accordingly, a polarization direction of the light passing through the first polarizing film 21 and an oscillation direction of the light passing through the second polarizing film 29 are orthogonal to each other. As a result, in general, the light may not pass both the first polarizing film 21 and the second polarizing film 29 at the same time.

The color filter 27 may be provided on an inner side of the second transparent substrate 28.

The color filter 27 may, for example, include a red filter 27R configured to transmit red light, a green filter 27G configured to transmit green light, and a blue filter 27B configured to transmit blue light. In addition, the red filter 27R, the green filter 27G, and the blue filter 27B may be disposed parallel to each other. A region in which the color filter 27 is formed may correspond to the pixel P described above. A region in which the red filter 27R is formed may correspond to the red sub-pixel $P_R$, a region in which the green filter 27G is formed may correspond to the green sub-pixel $P_G$, and a region in which the blue filter 27B is formed may correspond to the blue sub-pixel $P_B$.

The pixel electrode 23 may be provided on an inner side of the first transparent substrate 22, and the common electrode 26 may be provided on the inner side of the second transparent substrate 28.

The pixel electrode 23 and the common electrode 26 may be formed of a metal material through which electricity is conducted and may generate an electric field for changing the arrangement of liquid crystal molecules 115a constituting the liquid crystal layer 25 to be described below.

The pixel electrode 23 and the common electrode 26 may be formed of a transparent material for transmitting the incident light from the outside. For example, the pixel electrode 23 and the common electrode 26 may also be formed of indium tin oxide (ITO), indium zinc oxide (IZO), silver (Ag) nanowire, carbon nanotube (CNT), graphene, or 3,4-ethylenedioxythiophene (PEDOT).

The thin film transistor (TFT) 24 may be provided on the inner side of the second transparent substrate 112.

The TFT 24 may pass or block the current flowing in the pixel electrode 23. For example, by turning the TFT 24 on (closing) or off (opening), an electric field may be formed or removed from between the pixel electrode 23 and the common electrode 26.

The TFT 24 may be formed of poly-silicon and formed using a semiconductor process such as lithography, deposition, ion implantation process, and the like.

The liquid crystal layer 25 may be formed between the pixel electrode 23 and the common electrode 26 and is filled with the liquid crystal molecules 25a.

Liquid crystals may be in an intermediate state between solid (crystal) and fluid. Most liquid crystal materials are organic compounds whose molecules are shaped like thin and long rods, and the arrangement of the molecules may be irregular in a direction and regular in another direction. As a result, the liquid crystal may have both fluidity of a liquid and optical anisotropy of a crystal (solid).

Furthermore, the liquid crystal exhibits optical properties depending on a change in electric field. For example, an arrangement direction of the molecules constituting the liquid crystal may change depending on the change of the electric field. When an electric field is generated in the liquid crystal layer 25, the liquid crystal molecules 115a of the liquid crystal layer 25 may be arranged along the direction of the electric field, and when no electric field is generated in the liquid crystal layer 25, the liquid crystal molecules 115a may be irregularly arranged or arranged along the alignment layer (not shown). Accordingly, the optical properties of the liquid crystal layer 25 may change according to the presence or absence of an electric field passing through the liquid crystal layer 25.

On one side of the liquid crystal panel 20, provided may be a cable 20a for transmitting image data to the liquid crystal panel 20 and a display driver integrated circuit 30 (DDI, hereinafter, referred to as 'driver IC') for processing digital image data to output an analog image signal.

The cable 20a may electrically connect the control assembly 50, the power supply assembly 60 and the driver IC 30, and further electrically connect the driver IC 30 and the liquid crystal panel 20. The cable 20a may include a bendable flexible flat cable, a film cable, and the like.

The driver IC 30 may receive image data and power from the control assembly 50 and the power supply assembly 60 through the cable 20a, and transmit image data and drive current to the liquid crystal panel 20 through the cable 20a.

In addition, the cable 20a and the driver IC 30 may be integrally implemented as a film cable, a chip on film (COF), a table carrier package (TCP), or the like. In other words, the driver IC 30 may be disposed on a cable 110b, without being limited thereto. The driver IC 30 may be disposed on the liquid crystal panel 20.

The control assembly 50 may include a control circuit configured to control operations of the liquid crystal panel 20 and the backlight unit 100. The control circuit may process image data received from an external content source, transmit image data to the liquid crystal panel 20, and transmit dimming data to the backlight unit 100.

The power supply assembly 60 may supply power to the liquid crystal panel 20 and the backlight unit 100 so that the backlight unit 100 outputs surface light and the liquid crystal panel 20 blocks or transmits light from the backlight unit 100.

The control assembly 50 and the power supply assembly 60 may be implemented with a printed circuit board and various circuits mounted on the printed circuit board. For example, the power supply circuit may include a condenser, a coil, a resistance element, a processor, and the like and a power supply circuit board on which these elements are mounted. In addition, the control circuit may include a memory, a processor, and a control circuit board on which these elements are mounted.

Hereinafter, the backlight unit 100 is described.

FIG. 4 is an exploded perspective view of a backlight unit according to an embodiment.

The backlight unit 100 may include a light source module 110 generating light, a reflector sheet 120 reflecting light, the diffuser plate 130 uniformly diffusing light, and an optical sheet 140 improving a luminance of the output light.

The light source module 110 may include a plurality of light-emitting diodes (LEDs) 200 emitting light, and a substrate 112 fixedly supporting the plurality of LEDs 200.

The plurality of LEDs 200 may be arranged in a predetermined pattern such that light is emitted with uniform luminance. The plurality of LEDs 200 may be arranged such that a distance between one LED and each LED adjacent thereto is the same.

For example, as shown in FIG. 4, the plurality of LEDs 200 may be aligned in rows and columns. Accordingly, the plurality of LEDs may be arranged to form an approximate square by four adjacent light sources. In addition, any one LED is disposed adjacent to four LEDs, and a distance between one LED and each of the four LEDs adjacent thereto may be substantially the same.

As another example, the plurality of LEDs 200 may arranged in multiple rows, and an LED belonging to one row may be located in the middle of two LEDs belonging to adjacent rows. Accordingly, the plurality of LEDs may be arranged such that three adjacent LEDs form an approximate regular triangle. In this case, one LED is arranged to be adjacent to six other LEDs, and a distance between the one LED and each of the six LEDs adjacent thereto is substantially the same.

However, the arrangement of the plurality of LEDs 200 is not limited to the aforementioned pattern, and the plurality of LEDs 200 may be arranged in various patterns such that light is emitted with uniform luminance.

The LED 200 may employ an element configured to emit monochromatic light (e.g., light having a specific range of wavelengths, e.g., blue light) or white light (e.g., mixed light of red light, green light, and blue light) in various directions when powered.

The substrate 112 may fix the plurality of LEDs 200 to prevent the LEDs 200 from moving. In addition, the substrate 112 may supply power to each of the LEDs 200 so that the LED 200 may emit light.

The substrate 112 may fix the plurality of LEDs 200 and may be formed of a synthetic resin, tapered glass, or a printed circuit board (PCB) on which a conductive power supply line is formed to supply power to the LED 200.

The reflector sheet 120 may reflect light emitted from the plurality of light LEDs 200 in a forward direction or in a direction approximate to the forward direction.

A plurality of through holes 120a may be formed in the reflector sheet 120 at positions corresponding to each of the plurality of LEDs 200 of the light source module 110. Further, the LED 200 of the light source module 110 may pass through the through holes 120a and protrude forward from the reflector sheet 120.

For example, the plurality of LEDs 200 of the light source module 110 may be inserted into the plurality of through holes 120a formed in the reflector sheet 120 during an assembly process of the reflector sheet 120 and the light source module 110. Accordingly, the plurality of LEDs 200 of the light source module 110 may be located on a front side of the reflector sheet 120, while the substrate 112 of the light source module 110 is located on a rear side of the reflector sheet 120.

Accordingly, the plurality of LEDs 200 may emit light in front of the reflector sheet 120.

The plurality of LEDs 200 may emit light in different directions in front of the reflector sheet 120. The light may be emitted from the LED 200 not only toward the diffuser plate 130 but also toward the reflector sheet 120, and the reflector sheet 120 may reflect the light emitted toward the reflector sheet 120 toward the diffuser plate 130.

The light emitted from the LED 200 may pass various objects such as the diffuser plate 130, the optical sheet 140, and the like. When the light passes the diffuser plate 130 and the optical sheet 140, a portion of the incident light is reflected from surfaces of the diffuser plate 130 and the optical sheet 140. The reflector sheet 120 may reflect the light reflected by the diffuser plate 130 and the optical sheet 140.

The diffuser plate 130 may be disposed in front of the light source module 110 and the reflector sheet 120 to uniformly diffuse the light emitted from the LED 200 of the light source module 110.

As described above, the plurality of LEDs 200 may be located everywhere on a rear surface of the backlight unit 100. The plurality of LEDs 200 are equidistantly arranged on the rear surface of the backlight unit 100, but differences in luminance may exist depending on the positions of the plurality of LEDs 200.

To eliminate the difference in luminance due to the plurality of LEDs 200, the diffuser plate 130 may diffuse the light emitted from the plurality of LEDs 200 within the diffuser plate 130. In other words, the diffuser plate 130 may uniformly emit non-uniform light forward from the plurality of LEDs 200.

The optical sheet 140 may include various sheets for improving luminance of light incident on the optical sheet 140 or converting a property of light. For example, the optical sheet 140 may include a light conversion sheet 141, a first prism sheet 142, a second prism sheet 143, a reflective polarizing sheet 144, and the like.

The light conversion sheet 141 may be provided to convert a wavelength of monochromatic light formed in the LED 200. The light conversion sheet 141 may convert monochromatic light into white light by converting a wavelength of monochromatic light emitted from the LED 200. The light conversion sheet 141 may include a plurality of quantum dots (QDs) that convert a wavelength of light.

For example, the LED 200 may emit blue light, and the light conversion sheet 141 may convert a portion of the blue light into green light and red light by converting a wavelength of the portion of the blue light. As a portion of the blue light emitted from the LED 200 is converted into red light and green light by passing the light conversion sheet 141, the light passing through the light conversion sheet 141 and emitted forward of the light conversion sheet 141 may become white light.

The first and second prism sheets 142 and 143 may concentrate the light, thereby increasing the luminance. The first and second prism sheets 142 and 143 may have triangular prism patterns arranged adjacent to each other to form a plurality of bands.

The reflective polarizing sheet 144 may be a kind of polarizing film, and may transmit a portion of the incident light while reflecting the other portions to improve luminance. For example, the reflective polarizing sheet 144 may transmit light polarized in the same direction as a predetermined polarization direction of the reflective polarizing sheet 144 and reflect light polarized in a different direction from the predetermined polarization direction. In addition, the light reflected by the reflective polarizing sheet 144 may be recycled within the backlight unit 100, and such light recycle may improve the luminance of the display apparatus 10.

The optical sheet 140 is not limited to the sheets or films shown in FIG. 4, and may further include a variety of sheets or films such as protective sheets, diffuser sheets, and the like. The protective sheet may protect a rest of the optical sheet from physical damage. The diffuser sheet may diffuse light to improve uniformity of luminance.

Figure 5:
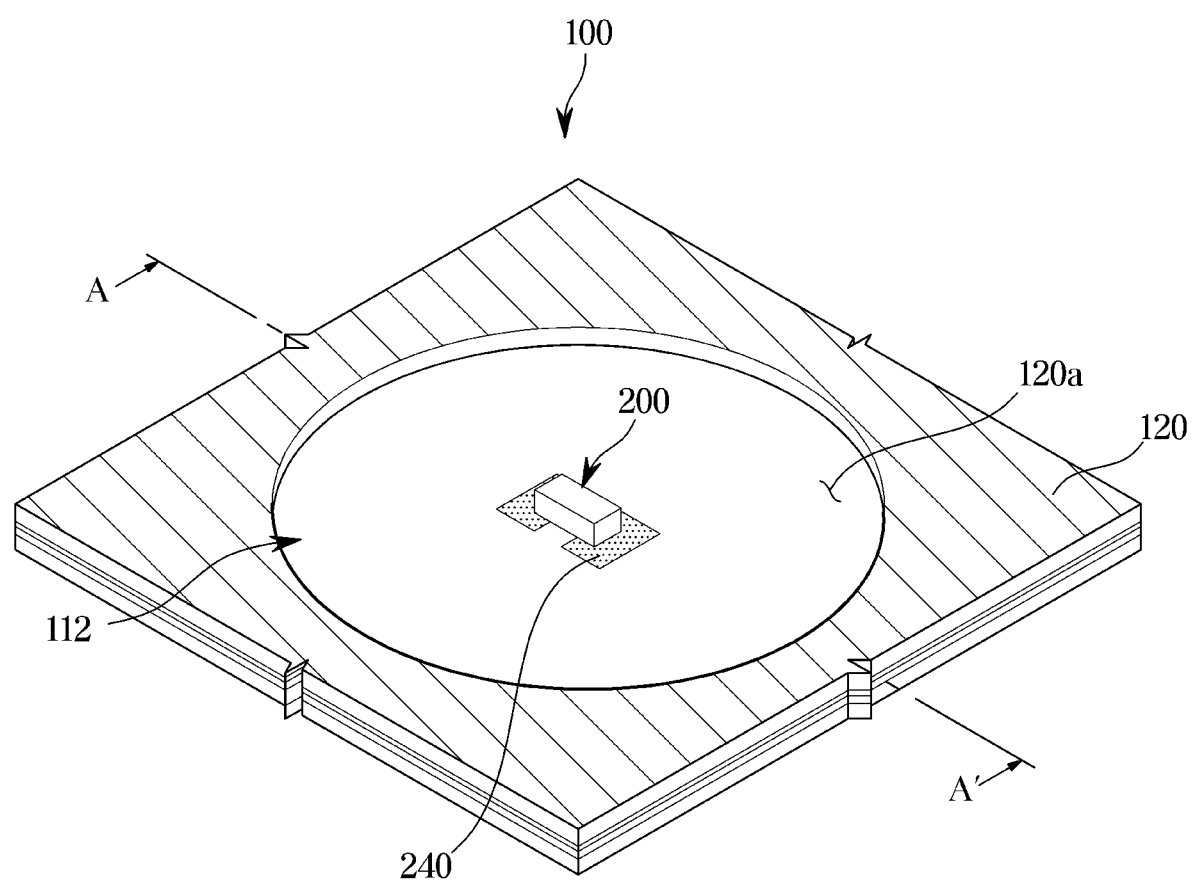
FIG. 5 is a schematic enlarged perspective view of a portion of a backlight unit of a display apparatus according to an embodiment.
Figure 6:
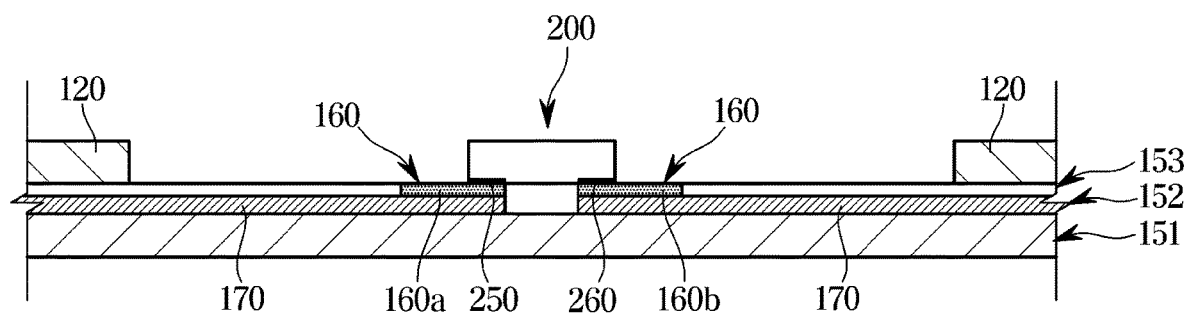
FIG. 6 is a cross-sectional view along line A-A' of FIG. 5.

FIG. 5 is a schematic enlarged perspective view of a portion of a backlight unit of a display apparatus according to an embodiment. FIG. 6 is a cross-sectional view along line A-A' of FIG. 5.

As described above, the light source module 110 may include the plurality of LEDs 200. The plurality of LEDs 200 may protrude forward of the reflector sheet 120 through the through holes 120a from behind the reflector sheet 120. Accordingly, as shown in FIG. 5 and FIG. 6, portions of the LED 200 and the substrate 112 may be exposed forward from the reflector sheet 120 through the through holes 120a.

With the above arrangement, light emitted from the LED 200 toward the reflector sheet 120 may be reflected from the reflector sheet 120 and directed forward.

The LED 200 may include a pair of electrodes 250 and 260.

Referring to FIG. 6, the substrate 112 may be formed by alternately stacking a non-conductive insulation layer 151 and a conduction layer 152.

A line or pattern through which power and/or electrical signals pass may be formed on the conduction layer 152. The conduction layer 152 may be formed of various electrically conductive materials. For example, the conduction layer 152 may be formed of various metal substances such as copper (Cu), tin (Sn), aluminum (Al), or an alloy thereof.

A dielectric of the insulation layer 151 may insulate gaps between lines or patterns of the conduction layer 152. The insulation layer 151 may be formed of a dielectric, such as FR-4, for electrical isolation.

A power feed line 170 may be implemented by a line or pattern formed on the conduction layer 152.

The power feed line 170 may be electrically connected to the LED 200 through a power feed pad 160.

The power feed pad 160 may be formed by exposing the power feed line 170 to the outside.

A protection layer 153 may be formed in an outermost portion of the substrate 112 to prevent or suppress damage to the substrate 112 due to external impact and/or chemical actions (e.g., corrosion) and/or optical actions. The protection layer 153 may include a photo solder resist (PSR).

As shown in FIG. 6, the protection layer 153 may cover the power feed line 170 to block the power feed line 170 from being exposed to the outside.

For electrical contact between the power feed line 170 and the LED 200, a window may be formed in the protection layer 153 to expose a portion of the power feed line 170 to the outside. A portion of the power feed line 170 exposed through the window of the protection layer 153 may form the power feed pad 160.

A conductive adhesive material 160a may be applied to the power feed pad 160 for electrical contact between the power feed line 170 exposed to the outside and the electrodes 250 and 260 of the LED 200. The conductive adhesive material 160a may be applied within the window of the protection layer 153.

The electrodes 250 and 260 of the LED 200 may be in contact with the conductive adhesive material 160a, and the LED 200 may be electrically connected to the power feed line 170 through the conductive adhesive material 160a and 160b.

The conductive adhesive material 160a and 160b may include, for example, electrically conductive solder without being limited thereto, and the conductive adhesive material 160a and 160b may include an electrically conductive epoxy adhesive.

Power may be supplied to the LED 200 through the power feed line 170 and the power feed pad 160, and the LED 200 may emit light when powered.

Figure 7:
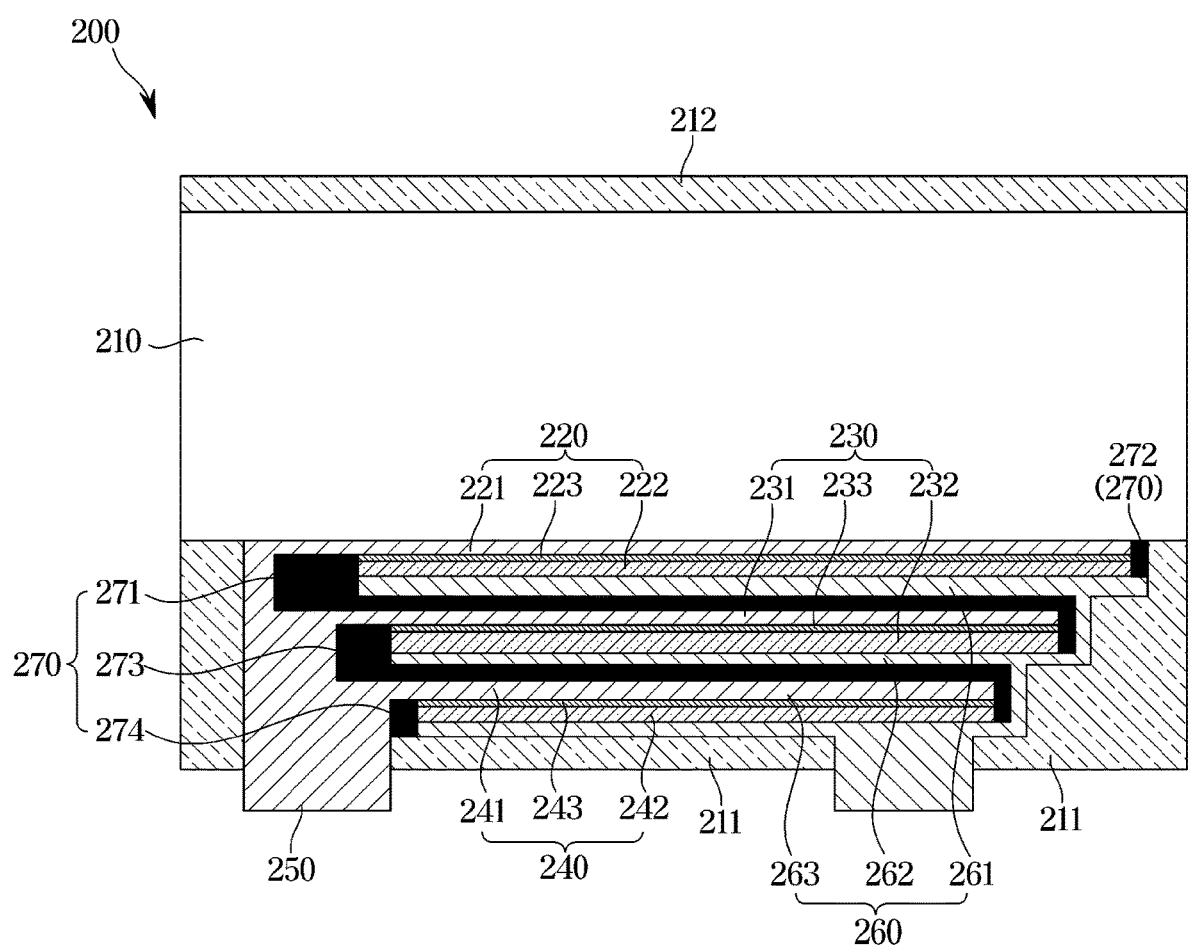
FIG. 7 is a diagram separately illustrating a light-emitting diode, in a display apparatus according to an embodiment.

FIG. 7 is a diagram separately illustrating a light-emitting diode, in a display apparatus according to an embodiment.

The LED 200 according to an embodiment is described in detail with reference to FIG. 7.

The LED 200 may include a p-type semiconductor layer and an n-type semiconductor layer to emit light based on recombination of holes and electrons. The LED 200 may include a pair of electrodes 250 and 260 for supplying holes and electrons to the p-type semiconductor layer and the n-type semiconductor layer, respectively.

According to an embodiment, the LED 200 may include a growth substrate 210, a plurality of light-emitting layers 220, 230 and 240, provided below the growth substrate 210, a common cathode 250 and a common anode 260. In addition, the LED 200 may include a first distributed Bragg reflector (DBR) layer 211 disposed below the plurality of light-emitting layers 220, 230 and 240, and a second DBR layer 212 disposed on an upper surface of the growth substrate 210.

The growth substrate 210 may use a sapphire substrate useful for a substrate for growth of nitride semiconductor without being limited thereto, but may be various substrates provided for single crystal semiconductor growth, such as a silicon substrate, a gallium nitride (GaN) substrate, and the like. According to an embodiment, the growth substrate 210 may be a sapphire substrate.

The plurality of light-emitting layers may be formed by stacking on the growth substrate 210. The plurality of light-emitting layers may include the first light-emitting layer 220, the second light-emitting layer 230, and the third light-emitting layer 240, without being limited thereto. The plurality of light-emitting layers may include two light-emitting layers or four or more light-emitting layers.

Each of the plurality of light-emitting layers may include the n-type semiconductor layer, the p-type semiconductor layer and a multi quantum well (MQW) layer formed between the n-type semiconductor layer and the p-type semiconductor layer. The n-type semiconductor layer, the p-type semiconductor layer and the MQW layer may be formed of nitride semiconductors. The MQW layer may emit as much light as band gap energy generated by recombining electrons and holes.

The pair of electrodes 250 and 260 may include the common cathode 250 and the common anode 260. The common anode 260 may be formed of materials capable of making ohmic contact with a nitride semiconductor, and may be formed, for example, of a metal such as silver (Ag), aluminum (Al), and the like.

Although the common cathode 250 is shown in FIG. 7 as being integrally formed with first to third n-type semiconductor layers 221, 231 and 241, the common cathode 250 may be formed of a material capable of making ohmic contact with the first to third n-type semiconductor layers 221, 231 and 241, and may be formed of, for example, a metal such as silver (Ag), aluminum (Al), and the like.

The first DBR layer 211 and the second DBR layer 212 may each be provided by repeatedly stacking up two materials having different refractive indexes. For example, the first DBR layer 211 and the second DBR layer 212 may each be formed by alternately stacking silicon dioxide $SiO_2$ and titanium dioxide $TiO_2$.

The first DBR layer 211 may be disposed below the third light-emitting layer 240. The first DBR layer 211 may reflect a portion of light emitted from the first to third light-emitting layers 220, 230 and 240 toward the substrate 112 in a forward direction, thereby may increase a light beam angle of the LED 200. In other words, a relatively large amount of light may be emitted from the sides of the LED 200, and the LED 200 may have a bat-wing-shaped optical profile.

The second DBR layer 212 may be arranged on an upper surface of the growth surface 210. The second DBR layer 212 may reflect a portion of the light emitted from the first to third light-emitting layers 220, 230 and 240 toward the substrate 112 in a rearward direction. The light reflected backward by the second DBR layer 212 may be reflected forward by the first DBR layer 211 and the reflector sheet 121. Through the above, the light beam angle of the LED 200 may be increased. In other words, a relatively large amount of light may be emitted from the sides of the LED 200, and the LED 200 may have a bat-wing-shaped optical profile.

The LED 200 may convert electric energy into optical energy. In other words, the LED 200 may emit light having the highest intensity at a predetermined wavelength at which power is supplied. For example, the LED 200 may emit blue light having a peak value at a wavelength representing a blue color (e.g., a wavelength between 430 nm and 480 nm).

The LED 200 may be attached directly to the substrate 112 in a chip-on-board (COB) arrangement, for example, via a COB method. In other words, the LED 200 may be attached directly to the substrate 112 without additional packaging.

The LED 200 may have a horizontal side length and a vertical side length of hundreds of μm. In other words, the horizontal and vertical side lengths of the upper surface of the growth substrate 210 may each be hundreds of μm. The horizontal and vertical side lengths of the upper surface of the growth substrate 210 may each be 500 μm or less.

In order to reduce an area occupied by the LED 200, the LED 200 may be manufactured in a flip chip type that does not include a Zener diode. An intermediate medium such as a metal lead (wire) or a ball grid array (BGA) is not used to attach the LED 200 of the flip chip type to the substrate 112, but an electrode pattern of the LED 200, which is the semiconductor device, may be fused onto the substrate 112 as is.

As described above, the flip-chip type LED 200 may be miniaturized by eliminating the metal lead (wire) or a ball grid array (BGA).

The LED 200 may include the growth substrate 210, the first light-emitting layer 220 disposed below the growth substrate 200, the second light-emitting layer 230 disposed below the first light-emitting layer 220, and the third light-emitting layer 240 disposed below the second light-emitting layer 230. The LED 200 may include the first DBR layer 211 disposed below the third light-emitting layer 240, and the second DBR layer 212 disposed on the upper surface of the growth substrate 210. Also, the LED 200 may include the common cathode 250 and the common anode 260 connected to the first to third light-emitting layers 220, 230 and 240.

The first light-emitting layer 220 may form light with a first wavelength $\lambda 1$. The first light-emitting layer 220 may include the first n-type semiconductor layer 221, the first p-type semiconductor layer 222, and a first MQW layer 223 formed between the first n-type semiconductor layer 221 and the first p-type semiconductor layer 222. The light with the first wavelength $\lambda 1$ may be formed in the first MQW layer 223 and emitted in all directions.

The second light-emitting layer 230 may form light with a second wavelength $\lambda 2$. The second light-emitting layer 230 may include the second n-type semiconductor layer 231, the second p-type semiconductor layer 232, and a second MQW layer 233 formed between the second n-type semiconductor layer 231 and the second p-type semiconductor layer 232. The light with the second wavelength $\lambda 2$ may be formed in the second MQW layer 233 and emitted in all directions.

The third light-emitting layer 240 may form light with a third wavelength $\lambda 3$. The third light-emitting layer 240 may include the third n-type semiconductor layer 241, the third p-type semiconductor layer 242, and a third MQW layer 243 formed between the third n-type semiconductor layer 241 and the third p-type semiconductor layer 242. The light with the third wavelength $\lambda 3$ may be formed in the third MQW layer 243 and emitted in all directions.

The wavelength of the light formed by each of the plurality of light-emitting layers may be greater than or equal to 430 nm and less than or equal to 480 nm. In other words, each of the plurality of light-emitting layers may form light in a blue color range. Furthermore, a wavelength difference between the light formed by two of the plurality of light-emitting layers may be 5 nm or more.

For example, the first wavelength $\lambda 1$ may be 440 nm, the second wavelength $\lambda 2$ may be greater than or equal to 445 nm, and the third wavelength λ3 may be greater than or equal to 450 nm. In contrast, the first wavelength λ1 may be greater than or equal to 450 nm, the second wavelength λ2 may be greater than or equal to 445 nm, and the third wavelength λ3 may be 440 nm, without being limited thereto. The first to third wavelengths λ1, λ2 and λ3 may be greater than or equal to 430 nm and less than or equal to 480 nm, as described above, and may have a wavelength difference of 5 nm or more from each other.

Light formed in the plurality of light-emitting layers may have a wavelength difference of 5 nm or more. When light having the same wavelength is formed by a plurality of light-emitting layers, light loss may occur due to light absorption. According to an embodiment, because the wavelengths of light formed in each of the plurality of light-emitting layers are not the same, light loss may not occur and light efficiency may be improved. In addition, because light is formed in the plurality of light-emitting layers, an light-emitting area may be increased, and thus light efficiency of LED may be improved. Efficiency of the backlight unit and the display apparatus may be improved due to the increase in light efficiency of the LED. In addition, because light is formed in the plurality of light-emitting layers, luminance of the LED may be improved. The luminance of the backlight unit and the display apparatus may be improved by the improving the luminance of the LED.

The LED 200 may include the common cathode 250 commonly connected to the first n-type semiconductor layer 221, the second n-type semiconductor layer 231, and the third n-type semiconductor layer 241. The LED 200 may also include the common anode 260 commonly connected to the first p-type semiconductor layer 222, the second p-type semiconductor layer 232, and the third p-type semiconductor layer 242.

The common cathode 250 may be integrally formed with the first n-type semiconductor layer 221, the second n-type semiconductor layer 231, and the third n-type semiconductor layer 241, without being limited thereto. The common cathode 250 may be formed of at least one of conductive materials such as indium tin oxide (ITO), silver (Ag) nano wire, carbon nano tube (CNT), graphene, or 3,4-ethylenedioxythiophene (PEDOT). In this case, the common cathode 250 may be provided to contact each of the first n-type semiconductor layer 221, the second n-type semiconductor layer 231, and the third n-type semiconductor layer 241.

The common anode 260 may include a first anode 261 in contact with the first p-type semiconductor layer 222, a second anode 262 in contact with the second p-type semiconductor layer 232, and a third anode 263 in contact with the third p-type semiconductor layer 242.

The common anode 260 may be formed of indium tin oxide (ITO). Alternatively, the common anode 260 may be formed of at least one of indium zinc oxide (IZO), silver (Ag) nano wire, carbon nano tube (CNT), graphene, or 3,4-ethylenedioxythiophene (PEDOT).

The LED 200 may include a blocking layer 270. The blocking layer 270 may be provided to block current. The blocking layer 270 may include a first blocking layer 271 that blocks electrical connection between the first p-type semiconductor layer 222 and the second n-type semiconductor layer 231, and a second blocking layer 273 that blocks electrical connection between the second p-type semiconductor layer 232 and the third n-type semiconductor layer 241.

The first blocking layer 271 may be provided at one end of the first n-type semiconductor layer 221, the first p-type semiconductor layer 222, and the first MQW layer 223, to block electrical connection among the first n-type semiconductor layer 221, the first p-type semiconductor layer 222 and the first MQW layer 223. In addition, the first blocking layer 271 may be provided at the other end of the second n-type semiconductor layer 231, the second p-type semiconductor layer 232, and the second MQW layer 233, to block electrical connection among the second n-type semiconductor layer 231, the second p-type semiconductor layer 232, and the second MQW layer 233. The one end and the other end may refer to a left side and a right side, respectively, based on FIG. 7.

The second blocking layer 273 may be provided at one end of the second n-type semiconductor layer 231, the second p-type semiconductor layer 232, and the second MQW layer 233, to block the electrical connection among the second n-type semiconductor layer 231, the second p-type semiconductor layer 232 and the second MQW layer 233. In addition, the second blocking layer 273 may be provided at the other end of the third n-type semiconductor layer 241, the third p-type semiconductor layer 242, and the third MQW layer 243, to block electrical connection among the third n-type semiconductor layer 241, the third p-type semiconductor layer 242 and the third MQW layer 243.

The blocking layer 270 may further include a third blocking layer 272 provided at the other end of the first n-type semiconductor layer 221, the first p-type semiconductor layer 222, and the first MQW layer 223 to block the electrical connection among the first n-type semiconductor layer 221, the first p-type semiconductor layer 222, and the first MQW layer 223.

The blocking layer 270 may further include a fourth blocking layer 274 provided at the one end of the third n-type semiconductor layer 241, the third p-type semiconductor layer 242, and the third MQW layer 243 to block the electrical connection among the third n-type semiconductor layer 241, the third p-type semiconductor layer 242, and the third MQW layer 243.

Figure 8:
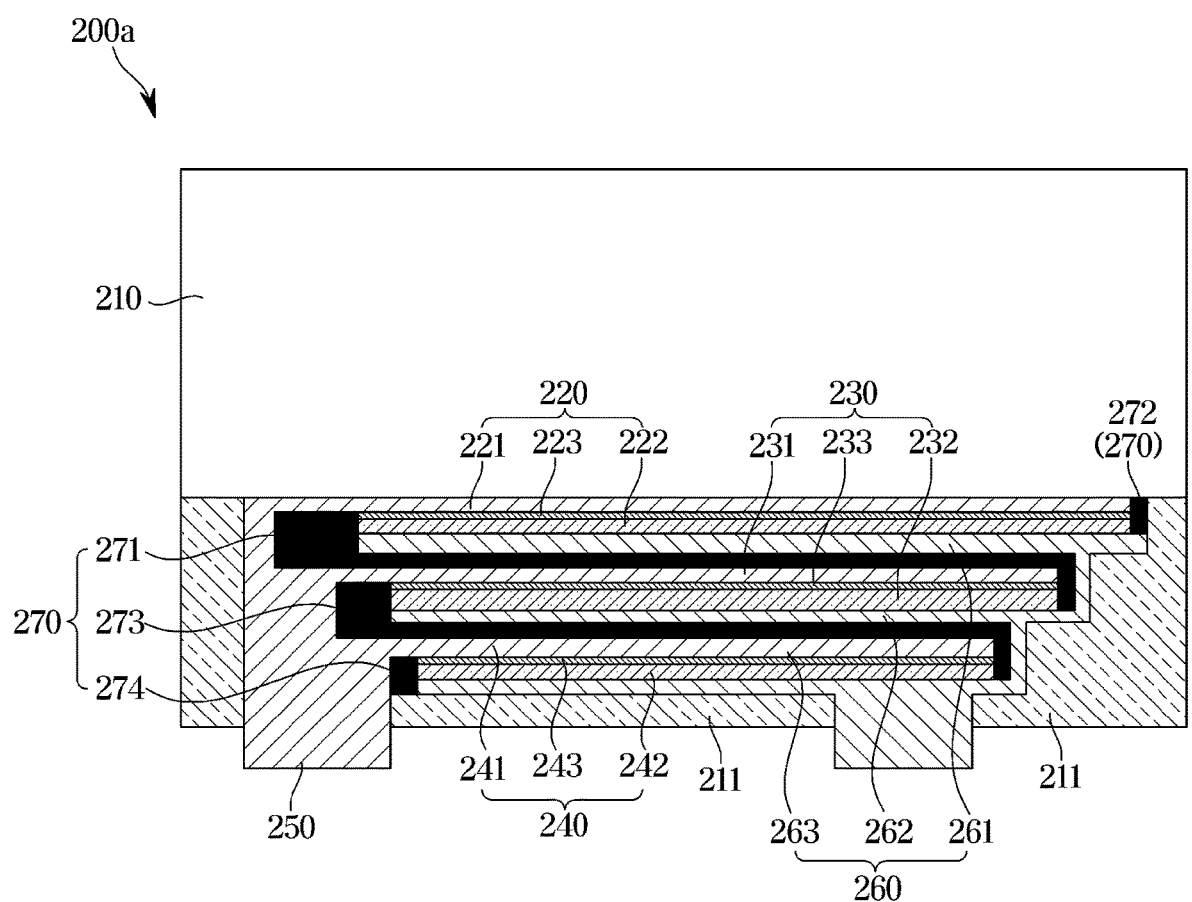
FIG. 8 is a diagram separately illustrating a light-emitting diode, in a display apparatus according to an embodiment.

FIG. 8 is a diagram separately illustrating a light-emitting diode, in a display apparatus according to an embodiment.

Referring to FIG. 8, an LED 200*a* may not include a second DBR layer arranged on an upper surface of the growth surface 210. The other configuration except for the second DBR layer is the same as the LED 200 shown in FIG. 7, and thus redundant description thereof is omitted.

Figure 9:
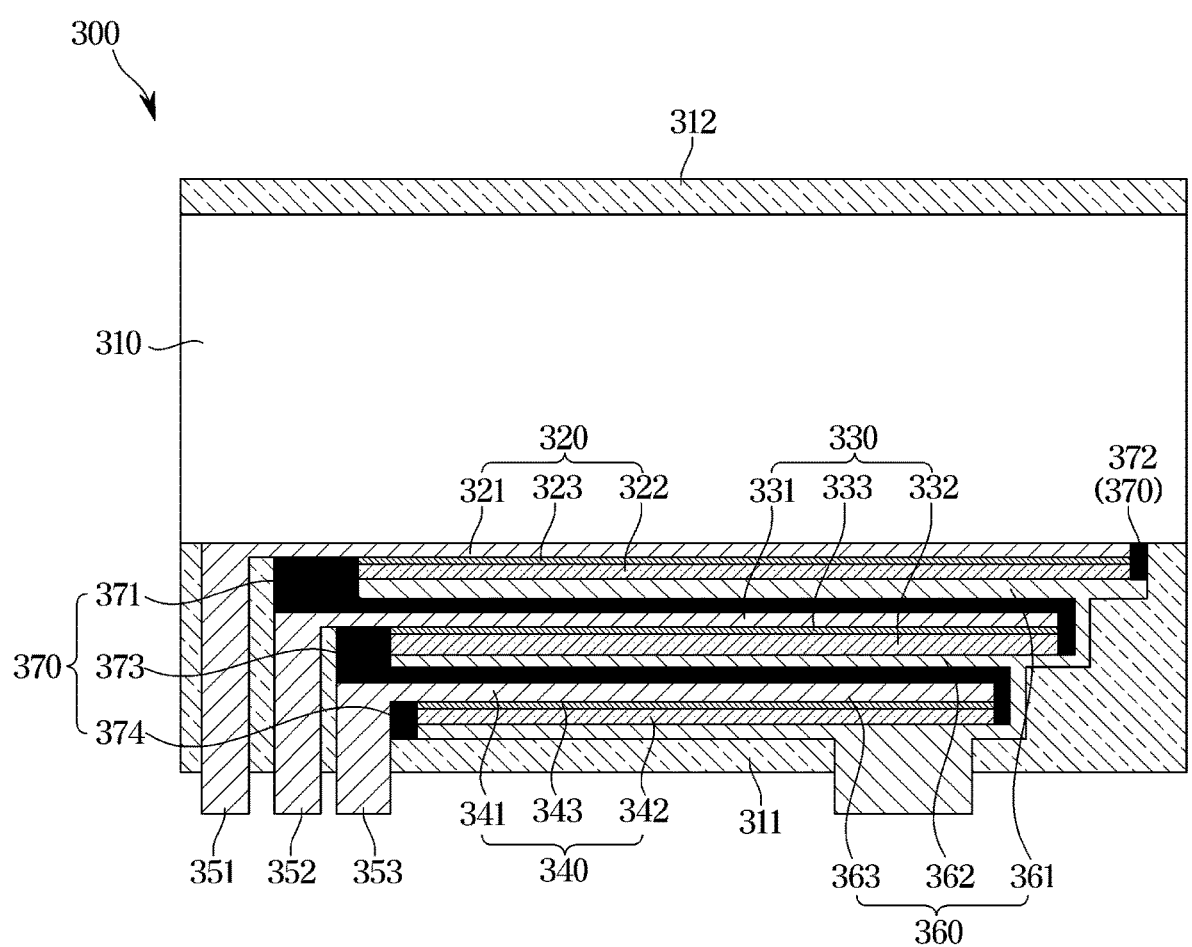
FIG. 9 is a diagram separately illustrating a light-emitting diode, in a display apparatus according to an embodiment.

FIG. 9 is a diagram separately illustrating a light-emitting diode, in a display apparatus according to an embodiment.

Referring to FIG. 9, an LED 300 may include a growth substrate 310, a plurality of light-emitting layers 320, 330 and 340, provided below the growth substrate 310, a first cathode 351, a second cathode 352, a third cathode 353, and a common anode 360. Further, the LED 300 may include a first DBR layer 311 disposed below the plurality of light-emitting layers 320, 330 and 340, and a second DBR layer 312 disposed on an upper surface of the growth substrate 310. The LED 300 may include a blocking layer 370, and the blocking layer 370 may include first to fourth blocking layers 371, 372, 373, and 374.

The growth substrate 310 may be a sapphire substrate.

Each of the first to third light-emitting layers 320, 330 and 340 may include a n-type semiconductor layer 321, 331, and 341, a p-type semiconductor layer 322, 332 and 342, and a MQW layer 323, 333 and 343 formed between the n-type semiconductor layer and the p-type semiconductor layer. The n-type semiconductor layers 321, 331, and 341, the p-type semiconductor layers 322, 332 and 342, and the MQW layers 323, 333 and 343 may be formed of nitride semiconductors. The MQW layers 323, 333 and 343 may emit as much light as band gap energy generated by recombining electrons and holes.

The first light-emitting layer 320 may form light with a first wavelength λ1, the second light-emitting layer 330 may form light with a second wavelength λ2, and the third light-emitting layer 340 may form light with a third wavelength λ3.

A wavelength of the light formed by each of the plurality of light-emitting layers may be greater than or equal to 430 nm and less than or equal to 480 nm. In other words, each of the plurality of light-emitting layers may form light in a blue color range. Furthermore, a wavelength difference between the light formed by two of the plurality of light-emitting layers may be 5 nm or more.

For example, the first wavelength λ1 may be 440 nm, the second wavelength λ2 may be greater than or equal to 445 nm, and the third wavelength λ3 may be greater than or equal to 450 nm. In contrast, the first wavelength λ1 may be greater than or equal to 450 nm, the second wavelength λ2 may be greater than or equal to 445 nm, and the third wavelength λ3 may be 440 nm, without being limited thereto. The first to third wavelengths λ1, λ2 and λ3 may be greater than or equal to 430 nm and less than or equal to 480 nm, as described above, and may have a wavelength difference of 5 nm or more from each other.

The first DBR layer 311 and the second DBR layer 312 may be provided by repeatedly stacking up two materials having different refractive indexes. For example, the first DBR layer 311 and the second DBR layer 312 may be formed by alternately stacking silicon dioxide $SiO_2$ and titanium dioxide $TiO_2$.

The first cathode 351 may be integrally formed with the first n-type semiconductor layer 321, the second cathode 352 may be integrally formed with the second n-type semiconductor layer 331, and the third cathode 353 may be integrally formed with the third n-type semiconductor layer 341, without being limited thereto. The first to third cathodes 351, 352 and 353 may be formed of at least one of conductive materials such as indium tin oxide (ITO), silver (Ag) nano wire, carbon nano tube (CNT), graphene, or 3,4-ethylenedioxythiophene (PEDOT). In this case, the first cathode 351 may be provided to contact the first n-type semiconductor layer 321, the second cathode 352 may be provided to contact the second n-type semiconductor layer 331, and the third cathode 353 may be provided to contact the third n-type semiconductor layer 341.

The common anode 360 may include a first anode 361 in contact with the first p-type semiconductor layer 322, a second anode 362 in contact with the second p-type semiconductor layer 332, and a third anode 363 in contact with the third p-type semiconductor layer 342.

The common anode 360 may be formed of indium tin oxide (ITO). Alternatively, the common anode 360 may be formed of at least one of indium zinc oxide (IZO), silver (Ag) nano wire, carbon nano tube (CNT), graphene, or 3,4-ethylenedioxythiophene (PEDOT).

The LED 300 may include a blocking layer 370. The blocking layer 370 may be provided to block current. The blocking layer 370 may include a first blocking layer 371 that blocks electrical connection between the first p-type semiconductor layer 322 and the second n-type semiconductor layer 331, and a second blocking layer 373 that blocks electrical connection between the second p-type semiconductor layer 332 and the third n-type semiconductor layer 341.

The first blocking layer 371 may be provided at one end of the first n-type semiconductor layer 321, the first p-type semiconductor layer 322, and the first MQW layer 323, to block electrical connection among the first n-type semiconductor layer 321, the first p-type semiconductor layer 322 and the first MQW layer 323. In addition, the first blocking layer 371 may be provided at the other end of the second n-type semiconductor layer 331, the second p-type semiconductor layer 332, and the second MQW layer 333, to block electrical connection among the second n-type semiconductor layer 331, the second p-type semiconductor layer 332, and the second MQW layer 333. The one end and the other end may refer to a left side and a right side, respectively, based on FIG. 7.

The second blocking layer 373 may be provided at one end of the second n-type semiconductor layer 331, the second p-type semiconductor layer 332, and the second MQW layer 333, to block the electrical connection among the second n-type semiconductor layer 331, the second p-type semiconductor layer 332 and the second MQW layer 333. In addition, the second blocking layer 373 may be provided at the other end of the third n-type semiconductor layer 341, the third p-type semiconductor layer 342, and the third MQW layer 343, to block electrical connection among the third n-type semiconductor layer 341, the third p-type semiconductor layer 342 and the third MQW layer 343.

The blocking layer 370 may further include a third blocking layer 372 provided at the other end of the first n-type semiconductor layer 321, the first p-type semiconductor layer 322, and the first MQW layer 323 to block the electrical connection among the first n-type semiconductor layer 321, the first p-type semiconductor layer 322, and the first MQW layer 323.

The blocking layer 370 may further include a fourth blocking layer 374 provided at the one end of the third n-type semiconductor layer 341, the third p-type semiconductor layer 342, and the third MQW layer 343 to block the electrical connection among the third n-type semiconductor layer 341, the third p-type semiconductor layer 342, and the third MQW layer 343.

Figure 10:
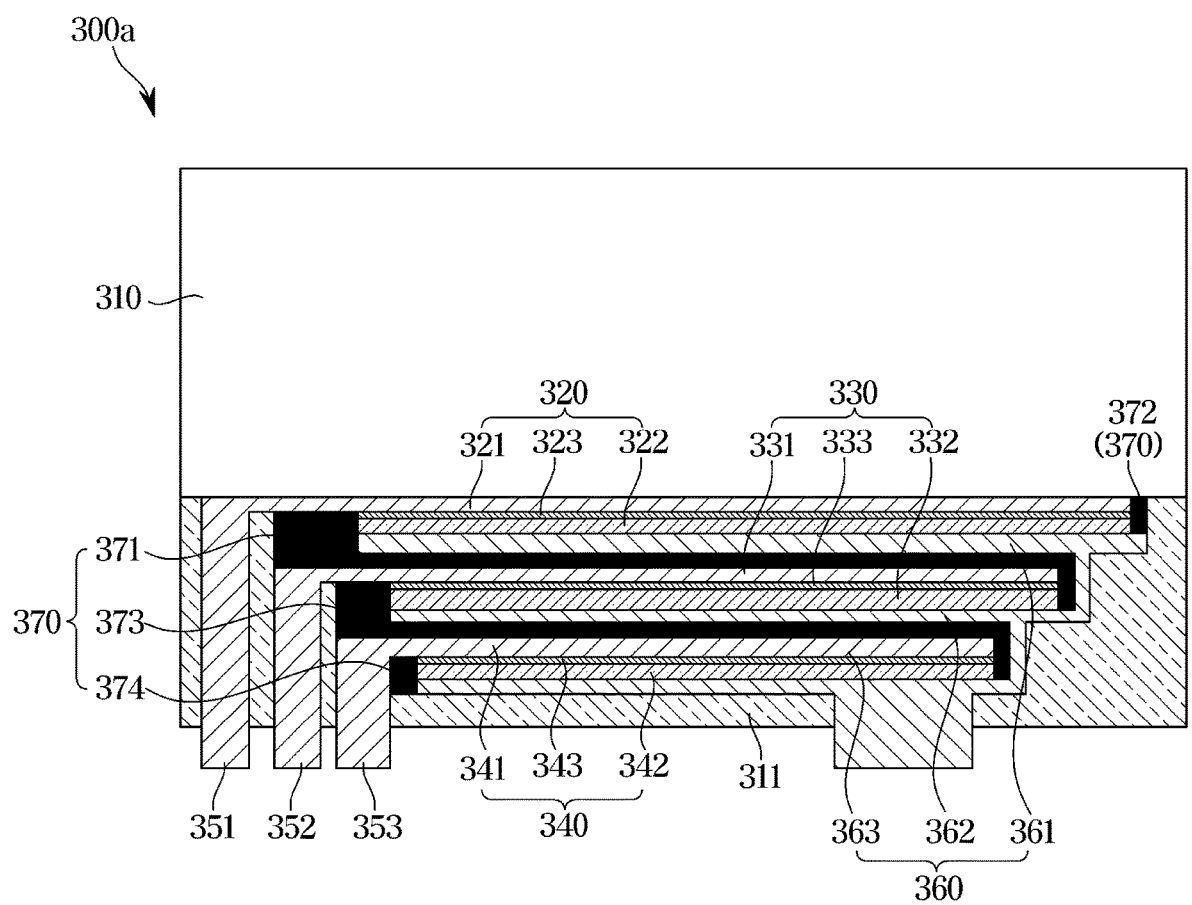
FIG. 10 is a diagram separately illustrating a light-emitting diode, in a display apparatus according to an embodiment.

FIG. 10 is a diagram separately illustrating a light-emitting diode, in a display apparatus according to an embodiment.

Referring to FIG. 10, an LED 300a may not include a second DBR layer arranged on an upper surface of the growth surface 310. The other configuration except for the second DBR layer is the same as the LED 300 shown in FIG. 9, and thus redundant description thereof is omitted.

Figure 11:
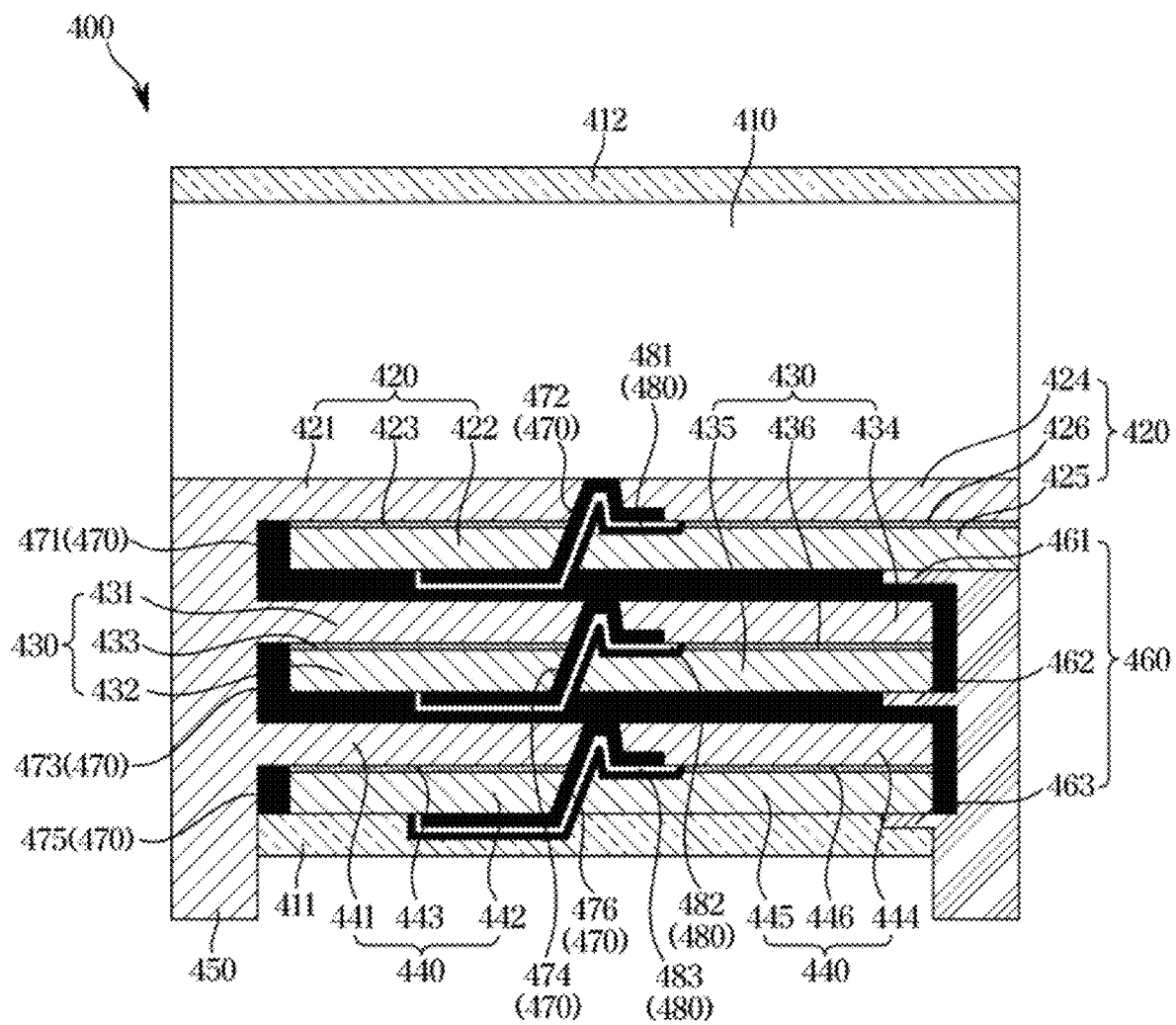
FIG. 11 is a diagram separately illustrating a light-emitting diode, in a display apparatus according to an embodiment.

FIG. 11 is a diagram separately illustrating a light-emitting diode, in a display apparatus according to an embodiment.

Referring to FIG. 11, an LED 400 may include a growth substrate 410, a plurality of light-emitting layers 420, 430 and 440, provided below the growth substrate 410, a blocking layer 470, a connection electrode 480, a common cathode 450, and a common anode 460. Further, the LED 400 may include a first DBR layer 411 disposed below the plurality of light-emitting layers 420, 430 and 440, and a second DBR layer 412 disposed on an upper surface of the growth substrate 410.

The growth substrate 410 may be a sapphire substrate. The first light-emitting layer 420 may be disposed below the growth substrate 410. The second light-emitting layer 430 may be disposed below the first light-emitting layer 420. The third light-emitting layer 440 may be disposed below the second light-emitting layer 430.

The first light-emitting layer 420 may include a plurality of cells. For example, the first light-emitting layer 420 may include first cells 421, 422 and 423, and second cells 424, 425 and 426. The first cells 421, 422 and 423 and the second cells 424, 425 and 426 may be partitioned by a first blocking layer 472. The first cell p-type semiconductor layer 422 of the first cell may be electrically connected to the second cell n-type semiconductor layer 424 of the second cell and a first connection electrode 481. Although the first light-emitting layer 420 partitioned into two cells is illustrated in FIG. 11, the first light-emitting layer 420 is not limited thereto. Each of the plurality of light-emitting layers may include three or more cells.

The first cells 421, 422 and 423 and the second cells 424, 425 and 426 may each form light with a first wavelength $\lambda 1$. The first cells 421, 422, and 423 and the second cells 424, 425, and 426 may form light having the same wavelength.

The second light-emitting layer 430 may include third cells 431, 432 and 433 and fourth cells 434, 435 and 436. The third cells 431, 432 and 433 and the fourth cells 434, 435 and 436 may be partitioned by a second blocking layer 474. The third cell p-type semiconductor layer 432 of the third cell may be electrically connected to the fourth cell n-type semiconductor layer 434 of the fourth cell and a second connection electrode 482.

The third cells 431, 432 and 433 and the fourth cells 434, 435 and 436 may each form light with a second wavelength $\lambda 2$. The third cells 431, 432 and 433 and the fourth cells 434, 435 and 436 may form light having the same wavelength.

The third light-emitting layer 440 may include fifth cells 441, 442 and 443 and sixth cells 444, 445 and 446. The fifth cells 441, 442 and 443 and the sixth cells 444, 445 and 446 may be partitioned by a third blocking layer 476. The fifth cell p-type semiconductor layer 442 of the fifth cell may be electrically connected to the sixth cell n-type semiconductor layer 444 of the sixth cell and a third connection electrode 483.

The fifth cells 441, 442 and 443 and the sixth cells 444, 445 and 446 may each form light with a third wavelength $\lambda 3$. The fifth cells 441, 442 and 443 and the sixth cells 444, 445 and 446 may form light having the same wavelength.

The first to sixth cells may include first to sixth MQW layers 423, 426, 433, 436, 443, and 446, respectively. The first to sixth MQW layers 423, 426, 433, 436, 443, and 446 may emit as much light as band gap energy generated by recombining electrons and holes.

A wavelength of the light formed by each of the plurality of cells may be greater than or equal to 430 nm and less than or equal to 480 nm. In other words, each of the plurality of cells may form light in a blue color range. Furthermore, a wavelength difference between the light formed by two of the plurality of cells may be 5 nm or more.

For example, the first wavelength $\lambda 1$ may be 440 nm, the second wavelength $\lambda 2$ may be greater than or equal to 445 nm, and the third wavelength $\lambda 3$ may be greater than or equal to 450 nm. In contrast, the first wavelength $\lambda 1$ may be greater than or equal to 450 nm, the second wavelength $\lambda 2$ may be greater than or equal to 445 nm, and the third wavelength $\lambda 3$ may be 440 nm, without being limited thereto. The first to third wavelengths $\lambda 1$, $\lambda 2$ and $\lambda 3$ may be greater than or equal to 430 nm and less than or equal to 480 nm, and may have a wavelength difference of 5 nm or more from each other.

The first DBR layer 411 and the second DBR layer 412 may be provided by repeatedly stacking up two materials having different refractive indexes. For example, the first DBR layer 411 and the second DBR layer 412 may be formed by alternately stacking silicon dioxide $SiO_2$ and titanium dioxide $TiO_2$.

The LED 400 may include the common cathode 450 and the common anode 460.

The common cathode 450 may be integrally formed with the first cell n-type semiconductor layer 421 of the first cell, the third cell n-type semiconductor layer 431 of the third cell, and the fifth cell n-type semiconductor layer 441 of the fifth cell, without being limited thereto. The common cathode 450 may be formed of at least one of conductive materials such as indium tin oxide (ITO), silver (Ag) nano wire, carbon nano tube (CNT), graphene, or 3,4-ethylenedioxythiophene (PEDOT). In this case, the common cathode 450 may be provided to contact each of the first cell n-type semiconductor layer 421, the third cell n-type semiconductor layer 431, and the fifth cell n-type semiconductor layer 441.

The common anode 460 may include a first anode 461 in contact with the second cell p-type semiconductor layer 425 of the second cell, a second anode 462 in contact with the fourth cell p-type semiconductor layer 435 of the fourth cell, and a third anode 463 in contact with the sixth cell p-type semiconductor layer 445 of the sixth cell.

The common anode 460 may be formed of indium tin oxide (ITO). Alternatively, the common anode 460 may be formed of at least one of indium zinc oxide (IZO), silver (Ag) nano wire, carbon nano tube (CNT), graphene, or 3,4-ethylenedioxythiophene (PEDOT).

The LED 400 may include a blocking layer 470. The blocking layer 470 may be provided to block current. The blocking layer 470 may include a first blocking layer 472 provided to insulate between the first cells 421, 422 and 423 and the second cells 424, 425 and 426, a second blocking layer 474 provided to insulate between the third cells 431, 432, and 433 and the fourth cells 434, 435, and 436, and a third blocking layer 476 provided to insulate between the fifth cells 441, 442, and 443 and the sixth cells 444, 445, and 446.

In addition, the blocking layer 470 may further include a fourth blocking layer 471 provided to insulate between the first cell p-type semiconductor layer 422 and the third cell n-type semiconductor layer 431 and between the second cell p-type semiconductor layer 425 and the fourth cell n-type semiconductor layer 434, and a fifth blocking layer 473 provided to insulate between the third cell p-type semiconductor layer 432 and the fifth cell n-type semiconductor layer 441 and between the fourth cell p-type semiconductor layer 435 and the sixth cell n-type semiconductor layer 444.

The fourth blocking layer 471 may insulate one end of the first MQW layer 423 from one end of the first cell p-type semiconductor layer 422, and may insulate the other end of the fourth cell n-type semiconductor layer 434, the other end of the fourth MQW layer 436, and the other end of the fourth cell p-type semiconductor layer 435. The one end and the other end may refer to a left side and a right side, respectively, based on FIG. 11.

The fifth blocking layer 473 may insulate one end of the third MQW layer 433 from one end of the third cell p-type semiconductor layer 432, and may insulate the other end of the sixth cell n-type semiconductor layer 444, the other end of the sixth cell p-type semiconductor layer 445 and the other end of the sixth MQW layer 446.

In addition, the blocking layer 470 may further include a sixth blocking layer 475 provided to insulate one end of the fifth MQW layer 443 and one end of the fifth cell p-type semiconductor layer 442.

The LED 400 may include the connection electrode 480.

The connection electrode 480 may include a first connection electrode 481 connecting the first cell p-type semiconductor layer 422 and the second cell n-type semiconductor layer 424, a second connection electrode 482 connecting the third cell p-type semiconductor layer 432 and the fourth cell n-type semiconductor layer 434, and a third connection electrode 483 connecting the fifth cell p-type semiconductor layer 442 and the sixth cell n-type semiconductor layer 444.

As described above, the LED 400 may include the plurality of light-emitting layers, and each of the plurality of light-emitting layers may include a plurality of cells. For example, the LED 400 may include three light-emitting layers, and each of the light-emitting layers may include two cells.

When a light-emitting layer of the LED 400 include a plurality of cells, light efficiency and energy efficiency may be improved.

When a light-emitting layer includes a plurality of cells and the power of the LED 400 is the same, the current flowing through the LED 400 decreases. For example, when a light-emitting layer includes two cells, a voltage doubles due to the two cells connected in series, and a magnitude of the current flowing through the two cells is halved. When the magnitude of the current flowing through the LED 400 is reduced, power loss due to wiring resistance may be reduced. Accordingly, energy efficiency of the LED 400 may be improved.

As described above, in response to current flowing through the plurality of cells being reduced, a density of the current is reduced, and a probability of recombining of holes and electrons is increased, thereby improving light efficiency. That is, light efficiency of the LED 400 may be improved.

Figure 12:
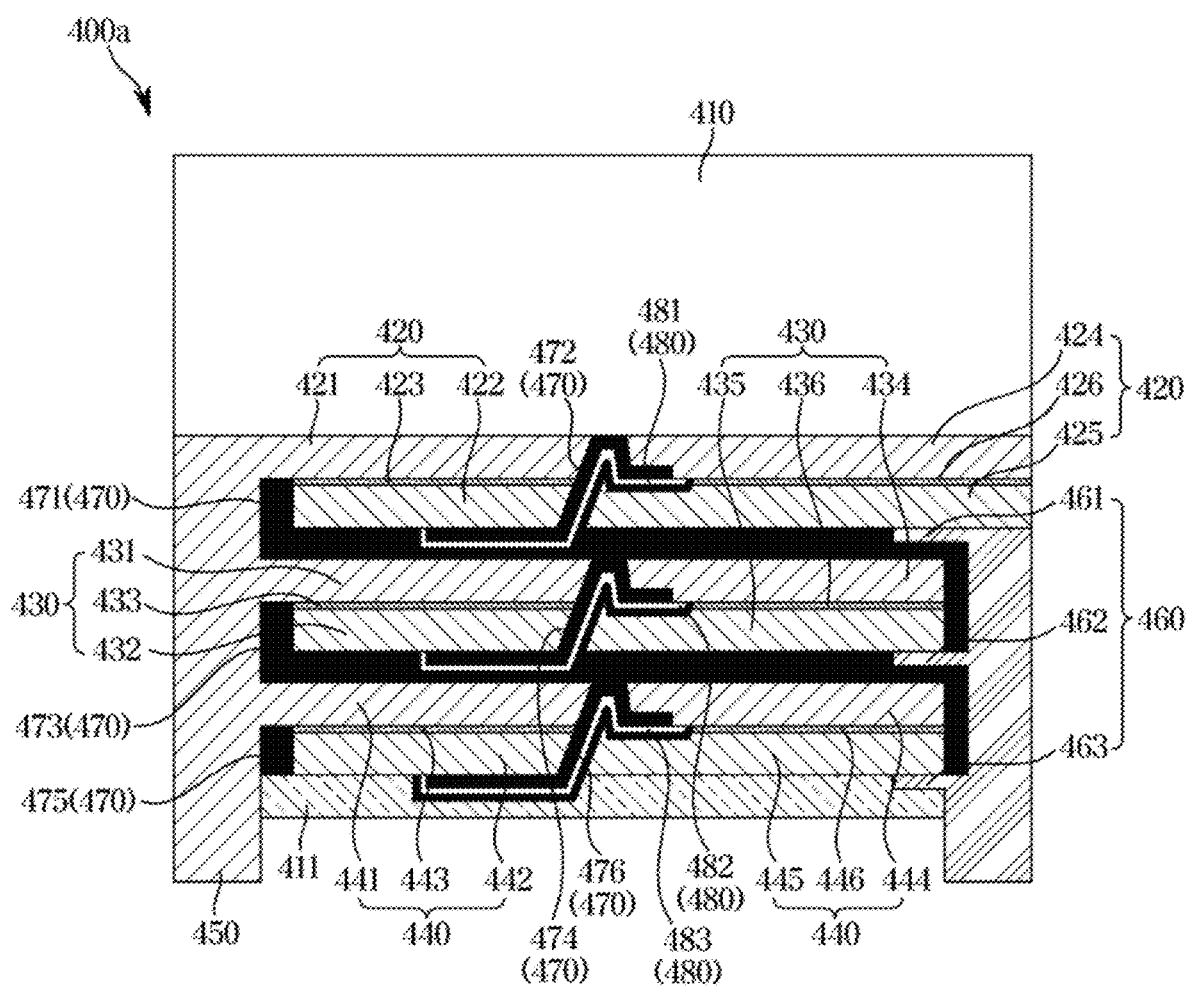
FIG. 12 is a diagram separately illustrating a light-emitting diode, in a display apparatus according to an embodiment.

FIG. 12 is a diagram separately illustrating a light-emitting diode, in a display apparatus according to an embodiment.

Referring to FIG. 12, an LED 400*a* may not include a second DBR layer arranged on an upper surface of the growth surface 410. The other configuration except for the second DBR layer is the same as the LED 400 shown in FIG. 11, and thus redundant description thereof is omitted.

Figure 13:
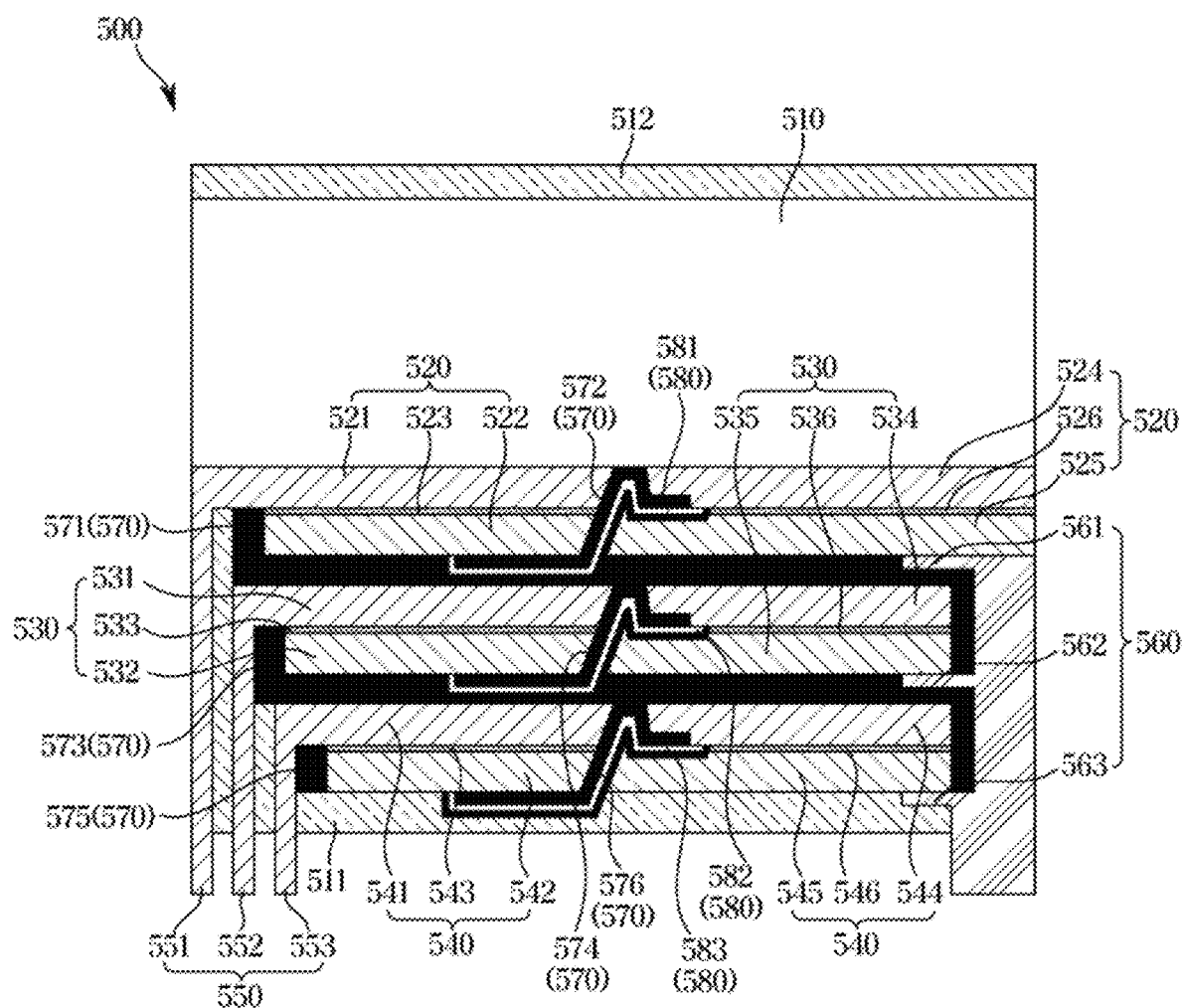
FIG. 13 is a diagram separately illustrating a light-emitting diode, in a display apparatus according to an embodiment.

FIG. 13 is a diagram separately illustrating a light-emitting diode, in a display apparatus according to an embodiment.

Referring to FIG. 13, an LED 500 may include a growth substrate 510, a plurality of light-emitting layers 520, 530 and 540, provided below the growth substrate 510, a blocking layer 570, a connection electrode 580, a common cathode 550, and a common anode 560. Further, the LED 500 may include a first DBR layer 511 disposed below the plurality of light-emitting layers 520, 530 and 540, and a second DBR layer 512 disposed on an upper surface of the growth substrate 510.

The growth substrate 510 may be a sapphire substrate. The first light-emitting layer 520 may be disposed below the growth substrate 510. The second light-emitting layer 530 may be disposed below the first light-emitting layer 520. The third light-emitting layer 540 may be disposed below the second light-emitting layer 530.

The first light-emitting layer 520 may include a plurality of cells. For example, the first light-emitting layer 520 may include first cells 521, 522 and 523, and second cells 524, 525 and 526. The first cells 521, 522 and 523 and the second cells 524, 525 and 526 may be partitioned by a first blocking layer 572. The first cell p-type semiconductor layer 522 of the first cell may be electrically connected to the second cell n-type semiconductor layer 524 of the second cell and a first connection electrode 581. Although the first light-emitting layer 520 partitioned into two cells is illustrated in FIG. 13, the first light-emitting layer 520 is not limited thereto. Each of the plurality of light-emitting layers may include three or more cells.

The first cells 521, 522 and 523 and the second cells 524, 525 and 526 may each form light with a first wavelength $\lambda 1$. The first cells 421, 422, and 423 and the second cells 424, 425, and 426 may form light having the same wavelength.

The second light-emitting layer 530 may include third cells 531, 532 and 533 and fourth cells 534, 535 and 536. The third cells 531, 532 and 533 and the fourth cells 534, 535 and 536 may be partitioned by a second blocking layer 574. The third cell p-type semiconductor layer 532 of the third cell may be electrically connected to the fourth cell n-type semiconductor layer 534 of the fourth cell and a second connection electrode 582.

The third cells 531, 532 and 533 and the fourth cells 534, 535 and 536 may each form light with a second wavelength $\lambda 2$. The third cells 531, 532 and 533 and the fourth cells 534, 535 and 536 may form light having the same wavelength.

The third light-emitting layer 540 may include fifth cells 541, 542 and 543 and sixth cells 544, 545 and 546. The fifth cells 541, 542 and 543 and the sixth cells 544, 545 and 546 may be partitioned by a third blocking layer 576. The fifth cell p-type semiconductor layer 542 of the fifth cell may be electrically connected to the sixth cell n-type semiconductor layer 544 of the sixth cell and a third connection electrode 583.

The fifth cells 541, 542 and 543 and the sixth cells 544, 545 and 546 may each form light with a third wavelength $\lambda 3$. The fifth cells 541, 542 and 543 and the sixth cells 544, 545 and 546 may form light having the same wavelength.

The first to sixth cells may include first to sixth MQW layers 523, 526, 533, 536, 543, and 546, respectively. The first to sixth MQW layers 523, 526, 533, 536, 543, and 546 may emit as much light as band gap energy generated by recombining electrons and holes.

A wavelength of the light formed by each of the plurality of cells may be greater than or equal to 430 nm and less than or equal to 480 nm. In other words, each of the plurality of cells may form light in a blue color range. Furthermore, a wavelength difference between the light formed by two of the plurality of cells may be 5 nm or more.

For example, the first wavelength $\lambda 1$ may be 440 nm, the second wavelength $\lambda 2$ may be greater than or equal to 445 nm, and the third wavelength $\lambda 3$ may be greater than or equal to 450 nm. In contrast, the first wavelength $\lambda 1$ may be greater than or equal to 450 nm, the second wavelength $\lambda 2$ may be greater than or equal to 445 nm, and the third wavelength $\lambda 3$ may be 440 nm, without being limited thereto. The first to third wavelengths $\lambda 1$, $\lambda 2$ and $\lambda 3$ may be greater than or equal to 430 nm and less than or equal to 480 nm, and may have a wavelength difference of 5 nm or more from each other.

The first DBR layer 511 and the second DBR layer 512 may be provided by repeatedly stacking up two materials having different refractive indexes. For example, the first DBR layer 511 and the second DBR layer 512 may be formed by alternately stacking silicon dioxide $SiO_2$ and titanium dioxide $TiO_2$.

The LED 500 may include first to third cathodes 550 and the common anode 560.

The first cathode 551 may be integrally formed with the first cell n-type semiconductor layer 521, the second cathode 552 may be integrally formed with the third cell n-type semiconductor layer 531, and the third cathode 553 may be integrally formed with the fifth cell n-type semiconductor layer 541, without being limited thereto. The first to third cathodes 551, 552 and 553 may be formed of at least one of conductive materials such as indium tin oxide (ITO), silver (Ag) nano wire, carbon nano tube (CNT), graphene, or 3,4-ethylenedioxythiophene (PEDOT). In this case, the first cathode 551 may be provided to contact the first cell n-type semiconductor layer 521, the second cathode 552 may be provided to contact the second cell n-type semiconductor layer 531, and the third cathode 553 may be provided to contact the third cell n-type semiconductor layer 541.

The common anode 560 may include a first anode 561 in contact with the second cell p-type semiconductor layer 525 of the second cell, a second anode 562 in contact with the fourth cell p-type semiconductor layer 535 of the fourth cell, and a third anode 563 in contact with the sixth cell p-type semiconductor layer 545 of the sixth cell.

The common anode 560 may be formed of indium tin oxide (ITO). Alternatively, the common anode 560 may be formed of at least one of indium zinc oxide (IZO), silver (Ag) nano wire, carbon nano tube (CNT), graphene, or 3,4-ethylenedioxythiophene (PEDOT).

The LED 500 may include the blocking layer 570. The blocking layer 570 may be provided to block current. The blocking layer 570 may include a first blocking layer 572 provided to insulate between the first cells 521, 522 and 523 and the second cells 524, 525 and 526, a second blocking layer 574 provided to insulate between the third cells 531, 532 and 533 and the fourth cells 534, 535 and 536, and a third blocking layer 576 provided to insulate between the fifth cells 541, 542 and 543 and the sixth cells 544, 545 and 546.

In addition, the blocking layer 570 may further include a fourth blocking layer 571 provided to insulate between the first cell p-type semiconductor layer 522 and the third cell n-type semiconductor layer 531 and between the second cell p-type semiconductor layer 525 and the fourth cell n-type semiconductor layer 534, and a fifth blocking layer 573 provided to insulate between the third cell p-type semiconductor layer 532 and the fifth cell n-type semiconductor layer 541 and between the fourth cell p-type semiconductor layer 535 and the sixth cell n-type semiconductor layer 544.

The fourth blocking layer 571 may insulate one end of the first MQW layer 523 from one end of the first cell p-type semiconductor layer 522, and may insulate the other end of the fourth cell n-type semiconductor layer 534, the other end of the fourth MQW layer 536, and the other end of the fourth cell p-type semiconductor layer 535. The one end and the other end may refer to a left side and a right side, respectively, based on FIG. 13.

The fifth blocking layer 573 may insulate one end of the third MQW layer 533 from one end of the third cell p-type semiconductor layer 532, and may insulate the other end of the sixth cell n-type semiconductor layer 544, the other end of the sixth cell p-type semiconductor layer 545 and the other end of the sixth MQW layer 546.

In addition, the blocking layer 570 may further include a sixth blocking layer 575 provided to insulate one end of the fifth MQW layer 543 and one end of the fifth cell p-type semiconductor layer 542.

The LED 500 may include the connection electrode 580.

The connection electrode 580 may include a first connection electrode 581 connecting the first cell p-type semiconductor layer 522 and the second cell n-type semiconductor layer 524, a second connection electrode 582 connecting the third cell p-type semiconductor layer 532 and the fourth cell n-type semiconductor layer 534, and a third connection electrode 583 connecting the fifth cell p-type semiconductor layer 542 and the sixth cell n-type semiconductor layer 544.

As described above, the LED 500 may include the plurality of light-emitting layers, and each of the plurality of light-emitting layers may include a plurality of cells. For example, the LED 500 may include three light-emitting layers, and each of the light-emitting layers may include two cells.

When a light-emitting layer of the LED 500 include a plurality of cells, light efficiency and energy efficiency may be improved.

When a light-emitting layer includes a plurality of cells and the power of the LED 500 is the same, the current flowing through the LED 500 may decrease. For example, when a light-emitting layer includes two cells, a voltage doubles due to the two cells connected in series, and a magnitude of the current flowing through the two cells is halved. When the magnitude of the current flowing through the LED 500 is reduced, power loss due to wiring resistance may be reduced. Accordingly, energy efficiency of the LED 500 may be improved.

As described above, in response to current flowing through the plurality of cells being reduced, a density of the current may be reduced, and a probability of recombining of holes and electrons may be increased, thereby improving light efficiency. That is, light efficiency of the LED 500 may be improved.

Figure 14:
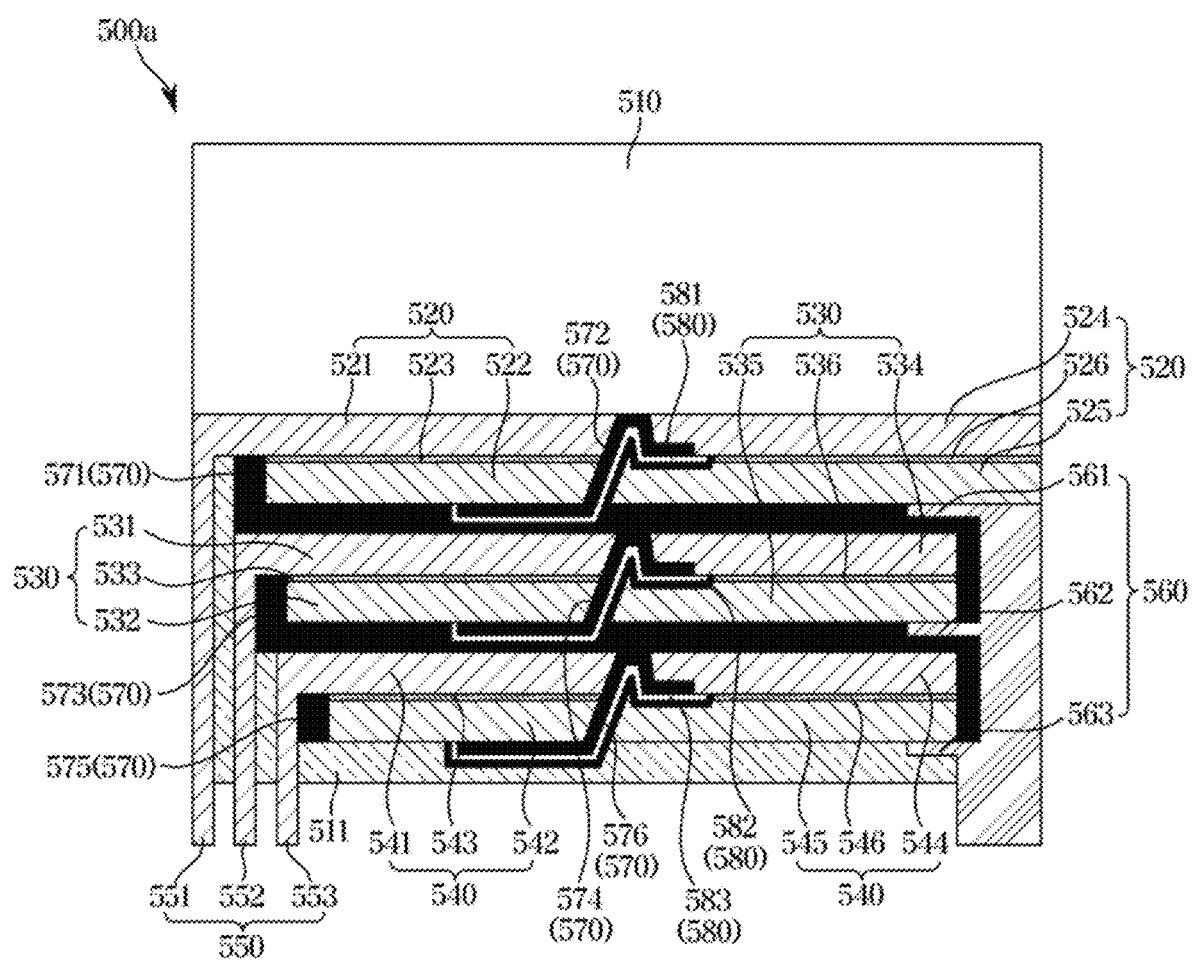
FIG. 14 is a diagram separately illustrating a light-emitting diode, in a display apparatus according to an embodiment.

FIG. 14 is a diagram separately illustrating a light-emitting diode, in a display apparatus according to an embodiment.

Referring to FIG. 14, an LED 500a may not include a second DBR layer arranged on an upper surface of the growth surface 510. The other configuration except for the second DBR layer is the same as the LED 500 shown in FIG. 13, and thus redundant description thereof is omitted.

The display apparatus may include a liquid crystal panel and a backlight unit which is configured to provide light to the liquid crystal panel and which includes a substrate and an LED mounted on the substrate.

The LED may include a plurality of light-emitting layers forming light with different wavelengths.

A wavelength of the light formed by each of the plurality of light-emitting layers may be greater than or equal to 430 nm and less than or equal to 480 nm.

A wavelength difference between the light formed by two of the plurality of light-emitting layers may be 5 nm or more.

The LED may further include a growth substrate, the plurality of light-emitting layers disposed below the growth substrate, and a first DBR layer disposed below the plurality of light-emitting layers.

The LED may further include a second DBR layer disposed on an upper surface of the growth substrate.

The plurality of light-emitting layers may include a first light-emitting layer that forms light with a first wavelength, is disposed below the growth substrate, and includes a first n-type semiconductor layer and a first p-type semiconductor layer.

The plurality of light-emitting layers may include a second light-emitting layer that forms light with a second wavelength longer than the first wavelength, is disposed below the first light-emitting layer, and includes a second n-type semiconductor layer and a second p-type semiconductor layer.

The plurality of light-emitting layers may include a third light-emitting layer that forms light with a third wavelength longer than the second wavelength, is disposed below the second light-emitting layer, and includes a third n-type semiconductor layer and a third p-type semiconductor layer.

The LED may include a first blocking layer that blocks electrical connection between the first p-type semiconductor layer and the second n-type semiconductor layer, and a second blocking layer that blocks electrical connection between the second p-type semiconductor layer and the third n-type semiconductor layer.

The LED may include a first blocking layer that blocks electrical connection between the first n-type semiconductor layer and the second p-type semiconductor layer, and a second blocking layer that blocks electrical connection between the second n-type semiconductor layer and the third p-type semiconductor layer.

The LED may include a common cathode commonly connected to the first n-type semiconductor layer, the second n-type semiconductor layer, and the third n-type semiconductor layer.

The LED may include a common anode commonly connected to the first p-type semiconductor layer, the second p-type semiconductor layer, and the third p-type semiconductor layer.

The LED may include a first cathode connected to the first n-type semiconductor layer, a second cathode connected to the second n-type semiconductor layer, a third cathode connected to the third n-type semiconductor layer, and a common anode commonly connected to the first p-type semiconductor layer, the second p-type semiconductor layer, and the third p-type semiconductor layer.

The plurality of light-emitting layers may include a first light-emitting layer disposed below the growth substrate and including a first cell and a second cell forming light with a first wavelength.

The plurality of light-emitting layers may include a second light-emitting layer disposed below the first light-emitting layer and including a third cell and a fourth cell forming light with a second wavelength longer than the first wavelength.

The plurality of light-emitting layers may include a third light-emitting layer disposed below the second light-emitting layer and including a fifth cell and a sixth cell forming light with a third wavelength longer than the second wavelength.

The LED may further include a first connection electrode connecting a first cell p-type semiconductor layer of the first cell and a second cell n-type semiconductor layer of the second cell, a second connection electrode connecting a third cell p-type semiconductor layer of the third cell and a fourth cell n-type semiconductor layer of the fourth cell, and a third connection electrode connecting a fifth cell p-type semiconductor layer of the fifth cell and a sixth cell n-type semiconductor layer of the sixth cell.

The LED may further include a first connection electrode connecting a first cell n-type semiconductor layer of the first cell and a second cell p-type semiconductor layer of the second cell, a second connection electrode connecting a third cell n-type semiconductor layer of the third cell and a fourth cell p-type semiconductor layer of the fourth cell, and a third connection electrode connecting a fifth cell n-type semiconductor layer of the fifth cell and a sixth cell p-type semiconductor layer of the sixth cell.

The LED may further include a first blocking layer that blocks electrical connection between the first connection electrode and the first cell n-type semiconductor layer of the first cell and electrical connection between the first connection electrode and the second cell p-type semiconductor layer of the second cell, a second blocking layer that blocks electrical connection between the second connection electrode and the third cell n-type semiconductor layer of the third cell and electrical connection between the second connection electrode and the fourth cell p-type semiconductor layer of the fourth cell, and a third blocking layer that blocks electrical connection between the third connection electrode and the fifth cell n-type semiconductor layer of the fifth cell and electrical connection between the third connection electrode and the sixth cell p-type semiconductor layer of the sixth cell.

The LED may further include a first blocking layer that blocks electrical connection between the first connection electrode and the first cell p-type semiconductor layer of the first cell and electrical connection between the first connection electrode and the second cell n-type semiconductor layer of the second cell, a second blocking layer that blocks electrical connection between the second connection electrode and the third cell p-type semiconductor layer of the third cell and electrical connection between the second connection electrode and the fourth cell n-type semiconductor layer of the fourth cell, and a third blocking layer that blocks electrical connection between the third connection electrode and the fifth cell p-type semiconductor layer of the fifth cell and electrical connection between the third connection electrode and the sixth cell n-type semiconductor layer of the sixth cell.

The LED may further include a common cathode commonly connected to the first cell n-type semiconductor layer, the third cell n-type semiconductor layer, and the fifth cell n-type semiconductor layer, and a common anode commonly connected to the second cell p-type semiconductor layer, the fourth cell p-type semiconductor layer, and the sixth cell p-type semiconductor layer.

The LED may further include a first cathode connected to the first cell n-type semiconductor layer, a second cathode connected to the third cell n-type semiconductor layer, a third cathode connected to the fifth cell n-type semiconductor layer, and a common anode commonly connected to the second cell p-type semiconductor layer, the fourth cell p-type semiconductor layer, and the sixth cell p-type semiconductor layer.

The backlight unit may further include a diffuser plate disposed between the substrate and the liquid crystal panel, and an optical sheet provided on one surface of the diffuser plate to be disposed between the diffuser plate and the liquid crystal panel, and including at least one of a light conversion sheet, a prism sheet, or a reflective polarizing sheet.

The LED may be mounted on the substrate in a chip on board (COB) method.

Although embodiments have been described with reference to the accompanying drawings, a person having ordinary skilled in the art will appreciate that other specific modifications may be easily made without departing from the technical spirit or essential features. Therefore, the foregoing embodiments should be regarded as illustrative rather than limiting in all aspects.

The invention claimed is:

1. A display apparatus, comprising:
a liquid crystal panel; and
a backlight configured to provide light to the liquid crystal panel, the backlight comprising a substrate and a light-emitting diode (LED) that is mounted on the substrate,
wherein the LED comprises:
 a plurality of light-emitting layers configured to emit light of different wavelengths, and
 at least one blocking layer provided between one of the plurality of light-emitting layers and another of the plurality of light-emitting layers and configured to block an electrical connection therebetween, and wherein a wavelength of light emitted from each of the plurality of light-emitting layers is greater than or equal to 430 nm and less than or equal to 480 nm.

2. A display apparatus, comprising:

a liquid crystal panel; and a backlight configured to provide light to the liquid crystal panel, the backlight comprising a substrate and a light-emitting diode (LED) that is mounted on the substrate, wherein the LED comprises:

a plurality of light-emitting layers configured to emit light of different wavelengths, the plurality of light-emitting layers respectively comprising an n-type semiconductor layer and a p-type semiconductor layer, and at least one blocking layer provided between one of the plurality of light-emitting layers and another of the plurality of light-emitting layers and configured to block an electrical connection therebetween, and wherein a wavelength of light emitted from each of the plurality of light-emitting layers is greater than or equal to 430 nm and less than or equal to 480 nm.

3. The display apparatus of claim 2, wherein a wavelength difference between lights emitted from two of the plurality of light-emitting layers is greater than or equal to 5 nm.

4. The display apparatus of claim 2, wherein the LED further comprises:

a growth substrate, the plurality of light-emitting layers being disposed below the growth substrate, and a first distributed Bragg reflector (DBR) layer disposed below the plurality of light-emitting layers.

5. The display apparatus of claim 4, wherein the LED further comprises a second DBR layer disposed on an upper surface of the growth substrate.

6. The display apparatus of claim 2, wherein the plurality of light-emitting layers comprises:

a first light-emitting layer configured to emit light of a first wavelength, the first light-emitting layer being disposed below the growth substrate, the first light-emitting layer comprising a first n-type semiconductor layer and a first p-type semiconductor layer, a second light-emitting layer configured to emit light of a second wavelength that is longer than the first wavelength, the second light-emitting layer being disposed below the first light-emitting layer, the second light-emitting layer comprising a second n-type semiconductor layer and a second p-type semiconductor layer, and a third light-emitting layer configured to emit light of a third wavelength that is longer than the second wavelength, the third light-emitting layer being disposed below the second light-emitting layer, the third light-emitting layer comprising a third n-type semiconductor layer and a third p-type semiconductor layer.

7. The display apparatus of claim 6, wherein the at least one blocking layer comprises:

a first blocking layer configured to block electrical connection between the first p-type semiconductor layer and the second n-type semiconductor layer, and a second blocking layer configured to block electrical connection between the second p-type semiconductor layer and the third n-type semiconductor layer.

8. The display apparatus of claim 6, wherein the LED further comprises:

a common cathode configured to be commonly connected to the first n-type semiconductor layer, the second n-type semiconductor layer, and the third n-type semiconductor layer, and a common anode configured to be commonly connected to the first p-type semiconductor layer, the second p-type semiconductor layer, and the third p-type semiconductor layer.

9. The display apparatus of claim 6, wherein the LED further comprises:

a first cathode configured to be connected to the first n-type semiconductor layer, a second cathode configured to be connected to the second n-type semiconductor layer, a third cathode configured to be connected to the third n-type semiconductor layer, and a common anode configured to be commonly connected to the first p-type semiconductor layer, the second p-type semiconductor layer, and the third p-type semiconductor layer.

10. The display apparatus of claim 2, wherein the backlight further comprises:

a diffuser plate disposed between the substrate and the liquid crystal panel, and an optical sheet disposed on one surface of the diffuser plate between the diffuser plate and the liquid crystal panel, the optical sheet comprising at least one of a light conversion sheet, a prism sheet, or a reflective polarizing sheet.

11. The display apparatus of claim 10, wherein the optical sheet comprises the light conversion sheet, and wherein the light conversion sheet comprises a plurality of quantum dots (QDs) that are configured to convert a wavelength of light.

12. The display apparatus of claim 11, wherein the optical sheet further comprises the prism sheet, wherein the prism sheet is configured to concentrate light to increase luminance, and wherein the prism sheet comprises triangular prism patterns arranged adjacent to each other to form a plurality of bands.

13. The display apparatus of claim 11, wherein the optical sheet further comprises the reflective polarizing sheet, and wherein the reflective polarizing sheet is configured to transmit a first portion of incident light while reflecting a second portion of the incident light to increase luminance.

14. The display apparatus of claim 2, wherein the LED is mounted on the substrate in a chip on board (COB) arrangement.

15. A display apparatus, comprising:

a liquid crystal panel; and a backlight configured to provide light to the liquid crystal panel, the backlight comprising a substrate and a light-emitting diode (LED) that is mounted on the substrate, wherein the LED comprises a plurality of light-emitting layers configured to emit light of different wavelengths, wherein the plurality of light-emitting layers comprises:

a first light-emitting layer disposed below a growth substrate, the first light-emitting layer comprising a first cell and a second cell configured to emit light of a first wavelength, a second light-emitting layer disposed below the first light-emitting layer, the second light-emitting layer comprising a third cell and a fourth cell configured to emit light of a second wavelength that is longer than the first wavelength, and a third light-emitting layer disposed below the second light-emitting layer, the third light-emitting layer comprising a fifth cell and a sixth cell configured to emit light of a third wavelength that is longer than the second wavelength, wherein a wavelength of light emitted from each of the plurality of light-emitting layers is greater than or equal to 430 nm and less than or equal to 480 nm.

16. The display apparatus of claim 15, wherein the LED further comprises:

a first connection electrode configured to connect a first cell p-type semiconductor layer of the first cell with a second cell n-type semiconductor layer of the second cell, a second connection electrode configured to connect a third cell p-type semiconductor layer of the third cell with a fourth cell n-type semiconductor layer of the fourth cell, and a third connection electrode configured to connect a fifth cell p-type semiconductor layer of the fifth cell with a sixth cell n-type semiconductor layer of the sixth cell.

17. The display apparatus of claim 16, wherein the LED further comprises:

a first blocking layer configured to block electrical connection (i) between the first connection electrode and a first cell n-type semiconductor layer of the first cell, and (ii) between the first connection electrode and a second cell p-type semiconductor layer of the second cell, a second blocking layer configured to block electrical connection (i) between the second connection electrode and a third cell n-type semiconductor layer of the third cell, and (ii) between the second connection electrode and a fourth cell p-type semiconductor layer of the fourth cell, and a third blocking layer configured to block electrical connection (i) between the third connection electrode and a fifth cell n-type semiconductor layer of the fifth cell, and (ii) between the third connection electrode and a sixth cell p-type semiconductor layer of the sixth cell.

18. The display apparatus of claim 17, wherein the LED further comprises:

a common cathode configured to be commonly connected to the first cell n-type semiconductor layer, the third cell n-type semiconductor layer, and the fifth cell n-type semiconductor layer, and a common anode configured to be commonly connected to the second cell p-type semiconductor layer, the fourth cell p-type semiconductor layer, and the sixth cell p-type semiconductor layer.

19. The display apparatus of claim 17, wherein the LED further comprises:

a first cathode configured to be connected to the first cell n-type semiconductor layer, a second cathode configured to be connected to the third cell n-type semiconductor layer, a third cathode configured to be connected to the fifth cell n-type semiconductor layer, and a common anode configured to be commonly connected to the second cell p-type semiconductor layer, the fourth cell p-type semiconductor layer, and the sixth cell p-type semiconductor layer.

20. The display apparatus of claim 16, wherein the first cell comprises the first cell p-type semiconductor layer, a first cell n-type semiconductor layer, and a first cell multi quantum well (MQW), the first cell MQW being disposed between the first cell p-type semiconductor layer and the first cell n-type semiconductor layer, wherein the second cell comprises a second cell p-type semiconductor layer, the second cell n-type semiconductor layer, and a second cell MQW, the second cell MQW being disposed between the second cell p-type semiconductor layer and the second cell n-type semiconductor layer, wherein the third cell comprises the third cell p-type semiconductor layer, a third cell n-type semiconductor layer, and a third cell MQW, the third cell MQW being disposed between the third cell p-type semiconductor layer and the third cell n-type semiconductor layer, wherein the fourth cell comprises a fourth cell p-type semiconductor layer, the fourth cell n-type semiconductor layer, and a fourth cell MQW, the fourth cell MQW being disposed between the fourth cell p-type semiconductor layer and the fourth cell n-type semiconductor layer, wherein the fifth cell comprises the fifth cell p-type semiconductor layer, a fifth cell n-type semiconductor layer, and a fifth cell MQW, the fifth cell MQW being disposed between the fifth cell p-type semiconductor layer and the fifth cell n-type semiconductor layer, and wherein the sixth cell comprises a sixth cell p-type semiconductor layer, the sixth cell n-type semiconductor layer, and a sixth cell MQW, the sixth cell MQW being disposed between the sixth cell p-type semiconductor layer and the sixth cell n-type semiconductor layer.

* * * * *